US006518791B2

(12) United States Patent
Kojima et al.

(10) Patent No.: US 6,518,791 B2
(45) Date of Patent: Feb. 11, 2003

(54) GATE DRIVER FOR DRIVING A SWITCHING ELEMENT, AND A POWER CONVERTER IN WHICH THE GATE DRIVER AND AN OUTPUT ELEMENT ARE INTEGRATED IN ONE-CHIP

(75) Inventors: Tsutomu Kojima, Yokohama; Hiroshi Takei, Sagamihara; Morio Takahashi, Ibo-gun; Akira Yamashita, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/811,448

(22) Filed: Mar. 20, 2001

(65) Prior Publication Data

US 2001/0024375 A1 Sep. 27, 2001

(30) Foreign Application Priority Data

Mar. 21, 2000 (JP) ........................................ 2000-078882
Jul. 28, 2000 (JP) ........................................ 2000-229158

(51) Int. Cl.[7] ................................................ H03K 3/00
(52) U.S. Cl. .............................. 326/82; 326/83; 326/21; 327/108; 327/396; 327/393
(58) Field of Search .............................. 326/82, 83, 21; 327/291, 298, 108, 396

(56) References Cited

U.S. PATENT DOCUMENTS 5,717,343 A * 2/1998 Kwong ........................ 326/27

6,094,086 A * 7/2000 Chow ........................ 327/396
6,335,638 B1 * 1/2002 Kwong et al. ................. 326/83

FOREIGN PATENT DOCUMENTS

| JP | 6-296363 | 10/1994 |
| JP | 7-15948 | 1/1995 |
| JP | 9-56177 | 2/1997 |
| JP | 9-233838 | 9/1997 |

* cited by examiner

Primary Examiner—Michael Tokar
Assistant Examiner—Vibol Tan
(74) Attorney, Agent, or Firm—Oblon, Spivak, McClelland, Maier & Neustadt, P.C.

(57) ABSTRACT

A gate driver includes an edge detection circuit, an ON pulse generation circuit, first and second OFF pulse generation circuit and a status hold circuit. The first OFF pulse generation circuit generates a first OFF pulse in response to a leading or trailing edge of a control input signal, which is detected by the edge detection circuit. The status hold circuit drives an output element in response to the ON pulse outputted from the ON pulse generation circuit and holds driving status of the output element until a first OFF pulse is outputted from the first OFF pulse generation circuit. The second OFF pulse generation circuit generates a second OFF pulse in response to a protect operation signal and supplies this pulse to the status hold circuit, thereby to stop driving of the output element.

22 Claims, 16 Drawing Sheets

GATE DRIVER FOR DRIVING A SWITCHING ELEMENT, AND A POWER CONVERTER IN WHICH THE GATE DRIVER AND AN OUTPUT ELEMENT ARE INTEGRATED IN ONE-CHIP

CROSS-REFERENCE TO RELATED APPLICATIONS

This application is based upon and claims the benefit of priority from the prior Japanese Patent Applications No. 2000-078882, filed Mar. 21, 2000; and No. 2000-229158, filed Jul. 28, 2000, the entire contents of both of which are incorporated herein by reference.

BACKGROUND OF THE INVENTION

The present invention relates to a gate driver for making control so as to turn ON/OFF an output element such as a power MOSFET, an IGBT (Insulated Gate Bipolar Transistor), or the like, and a power converter in which the gate driver and the output element are integrated in one-chip.

FIG. 1 is a block diagram showing the schematic structure of a conventional gate driver and a power converter. This circuit is constructed by an edge detection circuit 1, an ON pulse generation circuit 2, an OFF pulse generation circuit 3, a status hold circuit 4, an output element 9, and the like. The part surrounded by a broken line corresponds to the gate driver 10. The power converter is constructed by the gate driver 10 and the output element 9.

The edge detection circuit 1 is inputted with a control input signal and a protect operation signal and detects rise and fall of the control input signal. The ON pulse generation circuit 2 generates an ON pulse Pon in response to a leading edge of the control input signal detected by the edge detection circuit 1, and the OFF pulse generation circuit 3 generates an OFF pulse Poff in response to the trailing edge of the input signal detected by the edge pulse detection circuit 1. The status hold circuit 4 is inputted with an ON pulse Pon outputted from the ON pulse generation circuit 2, and a OFF pulse Poff outputted from the OFF pulse generation circuit. Based on the ON pulse Pon and OFF pulse Poff, the gate driving status of the output element 9 is held. That is, the status hold circuit 4 drives the gate of the output element 9 to turn on and maintains it turned on until the OFF pulse Poff is inputted.

When a leading edge is detected (timing t1) as shown in FIG. 2 in the structure as described above, an ON pulse Pon is outputted from an ON pulse generation circuit 2 and the gate of the output element 9 is driven to turn on. This ON status is held by the status hold circuit 4. When a trailing edge of the control input signal is detected by the edge detection circuit 1 (timing t2), an OFF pulse Poff is outputted from the OFF pulse generation circuit 3, and driving of the gate of the output element is stopped and turned off. This off status is held by the status hold circuit 4.

Meanwhile, when the protect operation signal rises in a state where a leading edge of the control input signal is detected by the edge detection circuit 1 and the gate of the output element is driven to turn on, the control input signal falls inside the edge detection circuit 1. This fall is detected and an OFF pulse Poff is outputted from the OFF pulse generation circuit 3 (timing t4), and driving of the output element 9 is stopped to turn off.

However, no OFF pulse Poff is generated even when an operation error which causes the output element 9 to turn on occurs (timing t5) due to some reason (noise, a voltage shift of an output part, or the like) and the operation error causes a protect operation signal to rise, in a state in which the control input signal indicates OFF ("L" level) of the output element 9. This is because the structure is arranged such that the control input signal is fixed to the "L" level inside the edge detection circuit 1 in synchronization with the protect operation signal. Therefore, at the timing t6, the control input signal is at "L" level and no trailing edge exists. Consequently, no OFF pulse Poff is generated. As a result, it is not possible to eliminate an abnormal operation which causes the output element 9 to turn on although the output element 9 should originally be turned off, but the output element 9 holds the on status, leading to breakdown.

FIG. 3 is a circuit diagram showing another structural example of a conventional gate driver. This gate driver 100 controls output elements (switching elements which are IGBTs in this case) 6 and 8 having a push/pull structure, and comprises a high-side gate driver circuit 101 for controlling a high-side switching element 6 to turn ON/OFF, a low-side gate driver circuit 102 for controlling the low-side switching element 8 to turn ON/OFF. The high-side gate driver circuit 101 is constructed by an edge detection circuit 1', an ON pulse generation circuit 2, an OFF pulse generation circuit 3, a latch circuit (corresponding to the status hold circuit 4 in FIG. 1) 4', a drive circuit 5, and the like. The low-side gate driver circuit 102 is structured to include a drive circuit 7.

The gate driver 100 drives the switching elements 6 and 8 in the high and low sides at individual operation voltages, respectively, so that the circuit in the high-side system and the circuit in the low-side system are operated at different reference voltages, respectively. The edge detection circuit 1', ON pulse generation circuit 2, and OFF pulse generation circuit 3 in the high-side gate driver circuit 101 are created by circuits of the low-side system, and the latch circuit 4' and drive circuit 5 are created by circuits of the high-side system. Also, the drive circuit 7 is created by a circuit of the low-side system. Further, the high-side input signal HS and the low-side input signal LS are both inputted as signals based on a reference voltage of the low-side system.

The high-side input signal HS for control the high-side switching element 6 to turn ON/OFF is inputted to the edge detection circuit 1', and the detection output from this edge detection circuit 1' is supplied to the ON pulse generation circuit 2 and the OFF pulse generation circuit 3. The ON pulse generation circuit 2 generates an ON pulse Pon in response to the leading edge of the high-side input signal HS detected by the edge detection circuit 1'. Also, the OFF pulse generation circuit 3 generates an OFF pulse Poff in response to the trailing edge of the high-side input signal HS detected by the edge detection circuit 1'. The ON pulse Pon outputted from the ON pulse generation circuit 2 and the OFF pulse Poff outputted from the OFF pulse generation circuit 3 are supplied to the latch circuit 4' so that ON/OFF information of the high-side switching element is held. Further, a high-side gate signal HG is outputted from the drive circuit 5, based on the latch circuit 4', and is supplied to the gate of the high-side switching element 6, so that this high-side switching element 6 is driven.

Meanwhile, the low-side input signal LS for controlling the low-side switching element 8 to turn ON/OFF is supplied to the drive circuit 7. The low-side gate signal LG outputted from this drive circuit 7 is supplied to the gate of the low-side switching element 8, so that this low-side switching element 8 is driven.

The high-side switching element 6 and the low-side switching element 6 are constructed in a push/pull structure.

The collector and emitter of the high-side switching element 6 are respectively connected to a power supply VC and an output terminal 11. The collector and emitter of the low-side switching element 8 are respectively connected to the output terminal 11 and a ground point GND.

Next, with respect to the structure as described above, operation will be explained with reference to a timing chart shown in FIG. 4. Driving of the high-side switching element 6 is carried out as follows. When a leading edge (timing t1) of the high-side input signal HS is detected by the edge detection circuit 1', an ON pulse Pon is generated from the ON pulse generation circuit 2. When a trailing edge of the high-side input signal HS (timing t2) is detected, an OFF pulse Poff is generated from the OFF pulse generation circuit 3. Since a pulse is used as the high-side input signal HS, signals can be transmitted while reducing, as much as possible, the current generated by the difference between the operation voltages or reference potentials of the circuits of the high-side system and the low-side system.

The ON/OFF information of the high-side switching element 6 transmitted in form of a pulse depending on the high-side input signal HS is inputted to the latch circuit 4 and held therein. Further, based on the ON/OFF information held in this latch circuit 4', the high-side gate signal HG is outputted from the drive circuit 5, thereby to drive the high-side switching element 6. That is, in response to the ON pulse Pon outputted from the ON pulse generation circuit 2, the high-side gate signal HG outputted from the drive circuit 5 goes to a high level ("H" level), so that the high-side switching element 6 is driven to turn on and this driving status is held by the latch circuit 4. Further, when an OFF pulse Poff is outputted from the OFF pulse generation circuit 3, the high-side gate signal HG outputted from the drive circuit 5 goes to a low level ("L" level), so that driving of the high-side switching element 6 is stopped (OFF).

In contrast, driving of the low-side switching element 8 is carried out in a manner that the low-side input signal LS is supplied to the drive circuit 7 and the low-side gate signal LG is supplied to the gate of the low-side switching element 8. That is, when the low-side input signal LS rises to the "H" level (timing t3), the low-side gate signal LG outputted from the drive circuit 7 goes to the "H" level so that the low-side switching element is driven to turn on. Further, when the low-side input signal LS falls to the "L" level (timing t4), the low-side gate signal LG outputted from the drive circuit 7 goes to the "L" level so that driving of the low-side switching element 8 is stopped (off).

However, in the gate driver having a structure as described above, the high-side input signal HS must be once converted into an ON pulse Pon and an OFF pulse Poff and must be converted again into ON/OFF signals of the high-side switching element, on the ground that signals must be transmitted from circuits of the low-side system to circuits of the high-side system having a different reference potential as that of the circuits of the low-side system. Therefore, an erroneous ON pulse is generated under influences from shifts of noise and outputs (e.g., voltage changes caused mainly between reference potentials). Even when OFF status of the high-side switching element 6 is instructed by the high-side input signal HS, there may be a possibility to turn on erroneously (corresponding to the operation at the timing t5). If the low-side switching element 8 is turned on (operation at the timing t6) in a state that the high-side switching element is suddenly turned on erroneously, a penetrating current flows between the power supply VC and the ground point GND, so that there may be a forced stop due to operation of an excessive current protect circuit (not shown) and breakdown of the switching elements 6 and 8 in the worst case.

BRIEF SUMMARY OF THE INVENTION

Therefore, the present invention has an object of providing a gate driver capable of preventing breakdown of output elements (switching elements).

The present invention also has another object of providing a gate driver and a power converter capable of eliminating abnormal operation even in case where output elements (switching elements) hold erroneously their on status.

The present invention has further another object of providing a gate driver capable of preventing high-side and low-side switching elements from simultaneously turning on even if the high-side switching element is erroneously rendered on when a high-side input signal instructs the high-side switching element to be off.

The present invention has further another object of providing a gate driver capable of preventing forced stop due to operation of an excessive current protect circuit which is caused by a penetrating current flowing between a power supply and a ground point.

The present invention has further another object of providing a gate driver capable of saving space and reducing costs.

The above-described objects of the present invention are achieved by a gate driver comprising: an edge detection circuit for detecting leading and trailing edges of a control input signal; an ON pulse generation circuit for generating an ON pulse in response to the leading or trailing edge of the control input signal, which is detected by the edge detection circuit; a first OFF pulse generation circuit for generating a first OFF pulse in response to the leading or trailing edge of the control input signal, which is detected by the edge detection circuit; a status hold circuit for driving an output element in response to the ON pulse outputted from the ON pulse generation circuit and for holding driving status of the output element until the first OFF pulse is outputted from the first OFF pulse generation circuit; and a second OFF pulse generation circuit for generating a second OFF pulse in response to a protect operation signal and for supplying the second OFF pulse to the status hold circuit, thereby to stop driving of the output element when protect operation is instructed by the protect operation signal.

According to the structure described above, the output element can be turned off by outputting a second OFF pulse from the second OFF pulse generation circuit, even if an output element is turned on due any reason when input of the control input signal is stopped. Therefore, it is possible to eliminate abnormal operation when the output element erroneously holds on status, and it is thus possible to prevent breakdown of the output element.

Also, the objects of the present invention are achieved by a gate driver comprising: an edge detection circuit supplied with a control input signal and a protect operation signal, for detecting leading and trailing edges of the control input signal, the edge detection circuit being let stop operating when protect operation is instructed by the protect operation signal; an ON pulse generation circuit for generating an ON pulse in response to the leading or trailing edge of the control input signal, which is detected by the edge detection circuit; a first OFF pulse generation circuit for generating a first OFF pulse in response to the leading or trailing edge of the control input signal, which is detected by the edge detection circuit; a status hold circuit for driving an output element and for holding driving status of the output element until the first OFF pulse is outputted from the first OFF pulse generation circuit; and a second OFF pulse generation circuit for generating a second OFF pulse in response to the control input signal and the protect operation signal and for providing the second OFF pulse to the status hold circuit, wherein when turn-off of the output element is instructed by the control input signal and protect operation is instructed by the protect operation signal, the second OFF pulse is outputted to stop driving of the output element.

According to the structure as described above, turn-off of an output element can be instructed by the control input signal even if the output element is turned on due to any reason when input of the control input signal is stopped, and the output element can be turned off by outputting the second OFF pulse from the second OFF pulse generation circuit when protect operation is instructed by the protect operation signal. Therefore, even if the output element erroneously holds the on status of the output element, abnormal operation can be eliminated so that breakdown of the output element can be prevented. Besides, even if the OFF pulse generation circuit erroneously operates due to noise or the like, the on status of the output element can be held when on of the output element is instructed by the control input signal. As a result, immunity can be improved.

Further, the objects of the present invention are achieved by a gate driver comprising: an abnormality detection circuit for detecting abnormal status; a protect operation signal generation circuit for generating a protect operation signal when an abnormality is detected by the abnormality detection circuit; a first determination circuit inputted with a control input signal of a high side, a control input signal of a low side, and the protect operation signal, for determining whether the control input signal of the high-side can be transmitted or not depending on status of the control input signal of the low side and the protect operation signal; a second determination circuit inputted with a control input signal of a high side, a control input signal of a low side, and the protect operation signal, for determining whether the control input signal of the low side can be transmitted or not depending on status of the control input signal of the high side and the protect operation signal, and to drive the low-side output element; a trigger signal generation circuit inputted with the protect operation signal, for generating a trigger signal for generating a high-side OFF pulse in synchronization with generation of the protect operation signal; a third determination circuit supplied with the trigger signal outputted from the trigger signal generation circuit and an output signal from the first determination circuit, for determining whether the trigger signal can be transmitted or not depending on status of the control input signal of the high side; an OFF pulse generation circuit supplied with the output signal from the first determination circuit and an output signal from the third determination circuits, for detecting falling of the control input signal of the high side and falling of the trigger signal and for generating an OFF pulse; an ON pulse generation circuit supplied with the output signal of the first determination circuit, for detecting rising of the control input signal of the high side, and for generating an ON pulse; and a status hold circuit for driving a high-side output element in response to the ON pulse outputted from the ON pulse generation circuit, and for holding driving status of the high-side output element until the OFF pulse is outputted from the OFF pulse generation circuit.

In this kind of structure, the side of the high-side output element which may cause abnormal operation can be steadily turned off when an abnormality is detected by the abnormality detection circuit in case where high-side and low-side output elements are used. Thus, abnormal operation is eliminated and breakdown of the output elements can be effectively prevented.

Further, the objects of the present invention are achieved by a power converter constructed by integrating a gate driver and an output element driven by the gate driver, in one-chip, the gate driver comprising: an edge detection circuit for detecting output element are formed in one-chip, so that space saving and cost reduction of the power converter can be achieved.

Also, the objects of the present invention are achieved by a power converter constructed by integrating a gate driver and high-side and low-side output elements driven by the gate driver, in one-chip, the gate driver comprising: an abnormality detection circuit for detecting abnormal status; a protect operation signal generation circuit for generating a protect operation signal when an abnormality is detected by the abnormality detection circuit; a first determination circuit inputted with a control input signal of a high side, a control input signal of a low side, and the protect operation signal, for determining whether the control input signal of the high-side can be transmitted or not depending on status of the control input signal of the low side and the protect operation signal; a second determination circuit inputted with a control input signal of a high side, a control input signal of a low side, and the protect operation signal, for determining whether the control input signal of the low side can be transmitted or not depending on status of the control input signal of the high side and the protect operation signal, and to drive the low-side output element; a trigger signal generation circuit inputted with the protect operation leading and trailing edges of a control input signal; an ON pulse generation circuit for generating an ON pulse in response to the leading or trailing edge of the control input signal, which is detected by the edge detection circuit; a first OFF pulse generation circuit for generating a first OFF pulse in response to the leading or trailing edge of the control input signal, which is detected by the edge detection circuit; a status hold circuit for driving the output element in response to the ON pulse outputted from the ON pulse generation circuit and for holding driving status of the output element until the first OFF pulse is outputted from the first OFF pulse generation circuit; and a second OFF pulse generation circuit for generating a second OFF pulse in response to a protect operation signal and for supplying the second OFF pulse to the status hold circuit, thereby to stop driving of the output element.

In the structure as described above, the output element can be turned off by outputting a second OFF pulse from the second OFF pulse generation circuit, even if an output element is turned on due any reason when input of the control input signal is stopped. Therefore, it is possible to eliminate abnormal operation when the output element erroneously holds on status, and it is thus possible to prevent breakdown of the output element. Besides, the gate driver and the signal, for generating a trigger signal for generating a high-side OFF pulse in synchronization with generation of the protect operation signal; a third determination circuit supplied with the trigger signal outputted from the trigger signal generation circuit and an output signal from the first determination circuit, for determining whether the trigger signal can be transmitted or not depending on status of the control input signal of the high side; an OFF pulse generation circuit supplied with the output signal from the first determination circuit and an output signal from the third determination circuits, for detecting falling of the control input signal of the high side and falling of the trigger signal and for generating an OFF pulse; an ON pulse generation circuit supplied with the output signal of the first determination circuit, for detecting rising of the control input signal of the high side, and for generating an ON pulse; and a status hold circuit for driving a high-side output element in response to the ON pulse outputted from the ON pulse generation circuit, and for holding driving status of the high-side output element until the OFF pulse is outputted from the OFF pulse generation circuit.

In this kind of structure, the side of the high-side output element which may cause abnormal operation can be steadily turned off when an abnormality is detected by the abnormality detection circuit in case where high-side and low-side output elements are used. Thus, abnormal operation is eliminated and breakdown of the output elements can be effectively prevented. Besides, the gate driver and the output elements are formed in one-chip, so that space saving and cost reduction can be achieved.

The above-described objects of the present invention are achieved by a gate driver for controlling high-side and low-side switching elements constructed in a push/pull structure, comprising a high-side gate driver circuit for driving the high-side switching element in response to a high-side input signal, and a low-side gate driver circuit for driving the low-side switching element, the high-side gate driver circuit including: a first edge detection circuit for detecting leading and trailing edges of the high-side input signal for driving the high-side switching element; a second edge detection circuit for detecting leading and trailing edges of the low-side input signal for driving the low-side switching element; an ON pulse generation circuit for generating an ON pulse, based on a detection output of the first edge detection circuit; an OFF pulse generation circuit for generating an OFF pulse, based on detection outputs of the first and second edge detection circuits; a latch circuit supplied with each of the ON pulse outputted from the ON pulse generation circuit and the OFF pulse outputted from the OFF pulse generation circuit, for holding ON/OFF information of the high-side switching element instructed by the high-side input signal; and a drive circuit for outputting a high-side gate signal for controlling the high-side switching element in accordance with the ON/OFF information held by the latch circuit, and when driving of the low-side switching element is instructed by the low-side input signal, the OFF pulse is generated from the OFF pulse generation circuit thereby to forcedly turn off the high-side switching element.

According to the structure as described above, the OFF pulse is generated from the OFF pulse generation circuit so that the high-side switching element is forcedly turned off when the low-side switching element is turned on even if the high-side switching element is suddenly tuned on erroneously due to influences of noise or a change of an output potential in a state where turn-off of the high-side switching element is instructed by a high-side input signal. It is therefore possible to prevent the high-side and low-side switching elements from being on simultaneously. Accordingly, it is possible to prevent forced stop and breakdown of switching elements due to operation of the excessive current protect circuit which is caused by a penetrating current flowing between the power supply and a ground point.

Also, the objects of the present invention are achieved by a power converter constructed by integrating a high-side and low-side switching elements having a push/pull structure, a high-side gate driver circuit for driving the high-side switching element in response to a high-side input signal, and a low-side gate driver circuit for driving the low-side switching element in response to a low-side input signal, in one-chip, the high-side gate driver circuit including: a first edge detection circuit for detecting leading and trailing edges of the high-side input signal for driving the high-side switching element; a second edge detection circuit for detecting leading and trailing edges of the low-side input signal for driving the low-side switching element; an ON pulse generation circuit for generating an ON pulse, based on a detection output of the first edge detection circuit; an OFF pulse generation circuit for generating an OFF pulse, based on detection outputs of the first and second edge detection circuits; a latch circuit supplied with each of the ON pulse outputted from the ON pulse generation circuit and the OFF pulse outputted from the OFF pulse generation circuit, for holding ON/OFF information of the high-side switching element instructed by the high-side input signal; and a drive circuit for outputting a high-side gate signal for controlling the high-side switching element in accordance with the ON/OFF information held by the latch circuit, wherein when driving of the low-side switching element is instructed by the low-side input signal, the OFF pulse is generated from the OFF pulse generation circuit thereby to forcedly turn off the high-side switching element.

According to the structure as described above, the OFF pulse is generated from the OFF pulse generation circuit so that the high-side switching element is forcedly turned off when the low-side switching element is turned on even if the high-side switching element is suddenly tuned on erroneously due to influences of noise or a change of an output potential in a state where turn-off of the high-side switching element is instructed by a high-side input signal. It is therefore possible to prevent the high-side and low-side switching elements from being on simultaneously. Accordingly, it is possible to prevent forced stop and breakdown of switching elements due to operation of the excessive current protect circuit which is caused by a penetrating current flowing between the power supply and a ground point. Besides, the gate driver and the output elements are formed in one-chip, so that space saving and cost reduction can be achieved.

Also, the objects of the present invention are achieved by a gate driver for controlling the high-side and low-side switching elements having a push/pull structure, comprising a high-side gate driver circuit for driving the high-side switching element in response to a high-side input signal, and a low-side gate driver circuit for driving the low-side switching element in response to a low-side input signal, the high-side gate driver circuit including: an edge detection circuit for detecting leading and trailing edges of the high-side input signal for driving the high-side switching element; an input terminal externally inputted with a high-side forced OFF signal for forcedly turning off the high-side switching element; an ON pulse generation circuit for generating an ON pulse, based on a detection output of the edge detection circuit; an OFF pulse generation circuit for generating an OFF pulse, based on the detection output of the edge detection circuit and the high-side forced OFF signal inputted through the input terminal; a latch circuit supplied with each of the ON pulse outputted from the ON pulse generation circuit and the OFF pulse outputted from the OFF pulse generation circuit, for holding ON/OFF information of the high-side switching element instructed by the high-side input signal; and a drive circuit for outputting a high-side gate signal for controlling the high-side switching element in accordance with the ON/OFF information held by the latch circuit, wherein when the input terminal is inputted with the high-side forced OFF signal, the high-side switching element is forcedly turned off.

According to the structure described above, the high-side switching element is forcedly turned off by a timing signal generated a high-side forced OFF signal inputted from the outside, e.g., a timing signal generated by an external control circuit (such as a micro-computer or the like). Therefore, the high-side switching element is forcedly turned off at an arbitrary timing at which erroneous turning-on easily occurs. While reducing the current consumption to the minimum, the high-side and low-side switching elements can be prevented from being on simultaneously. As a result, it is possible to prevent forced stop and breakdown of switching elements due to operation of the excessive current protect circuit which is caused by a penetrating current flowing between the power supply and a ground point.

Further, the objects of the present invention are achieved by a power converter constructed by integrating high-side and low-side switching elements having a push/pull structure, a high-side gate driver circuit for driving the high-side switching element in response to a high-side input signal, and a low-side gate driver circuit for driving the low-side switching element in response to a low-side input signal, in one-chip, the high-side gate driver circuit including: an edge detection circuit for detecting leading and trailing edges of the high-side input signal for driving the high-side switching element; an input terminal externally inputted with a high-side forced OFF signal for forcedly turning off the high-side switching element; an ON pulse generation circuit for generating an ON pulse, based on a detection output of the edge detection circuit; an OFF pulse generation circuit for generating an OFF pulse, based on the detection output of the edge detection circuit and the high-side forced OFF signal inputted through the input terminal; a latch circuit supplied with each of the ON pulse outputted from the ON pulse generation circuit and the OFF pulse outputted from the OFF pulse generation circuit, for holding ON/OFF information of the high-side switching element instructed by the high-side input signal; and a drive circuit for outputting a high-side gate signal for controlling the high-side switching element in accordance with the ON/OFF information held by the latch circuit, wherein when the input terminal is inputted with the high-side forced OFF signal, the high-side switching element is forcedly turned off.

According to the structure described above, the high-side switching element is forcedly turned off by a timing signal generated a high-side forced OFF signal inputted from the outside, e.g., a timing signal generated by an external control circuit (such as a micro-computer or the like). Therefore, the high-side switching element is forcedly turned off at an arbitrary timing at which erroneous turning-on easily occurs. While reducing the current consumption to the minimum, the high-side and low-side switching elements can be prevented from being on simultaneously. As a result, it is possible to prevent forced stop and breakdown of switching elements due to operation of the excessive current protect circuit which is caused by a penetrating current flowing between the power supply and a ground point. Besides, the gate driver and the output elements are formed in one-chip, so that space saving and cost reduction can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 5:
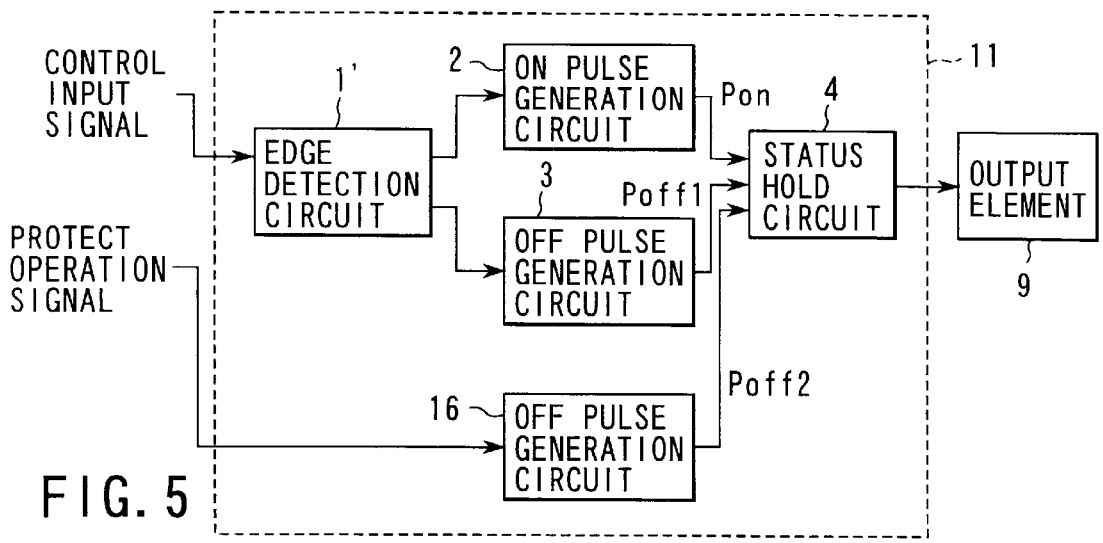
FIG. 5 is a block diagram showing a gate driver and a power converter according to the first embodiment of the present invention.

FIG. 5 is a block diagram showing a gate driver and a power converter according to the first embodiment of the present invention. This circuit is constructed by an edge detection circuit 1', an ON pulse generation circuit 2, a first OFF pulse generation circuit 3, a status hold circuit 4, an output element 9, a second OFF pulse generation circuit 16, and the like. The part surrounded by a broken line corresponds to the gate driver 11, and the power converter is constructed by the gate driver 11 and the output element 9.

The edge detection circuit 1' serves to detect leading and trailing edges of the control input signal. The ON pulse generation circuit 2 generates an ON pulse Pon in response to a leading (or trailing) edge of the control input signal detected by the edge detection circuit 1'. The OFF pulse generation circuit 3 generates an OFF pulse Poff1 in response to a trailing (or leading) edge detected by the edge detection circuit 1'. The OFF pulse generation circuit 16 is inputted with a protect operation signal, and generates an OFF pulse Poff2 for forcedly turning off the output element 9 in protect operation. The status hold circuit 4 is supplied with an ON pulse Pon outputted from the ON pulse generation circuit 2, an OFF pulse Poff1 outputted from the OFF pulse generation circuit 3, and an OFF pulse Poff2 outputted from the OFF pulse generation circuit 16. The gate status of the output element 9 is held, based on the ON pulse Pon and OFF pulse Poff1 and Poff2. That is, the status hold circuit 4 drives and turns on the gate of the output element 9 when an ON pulse Pon is inputted. The circuit 4 holds the on status until an OFF pulse Poff1 or Poff2 is inputted.

Figure 6:
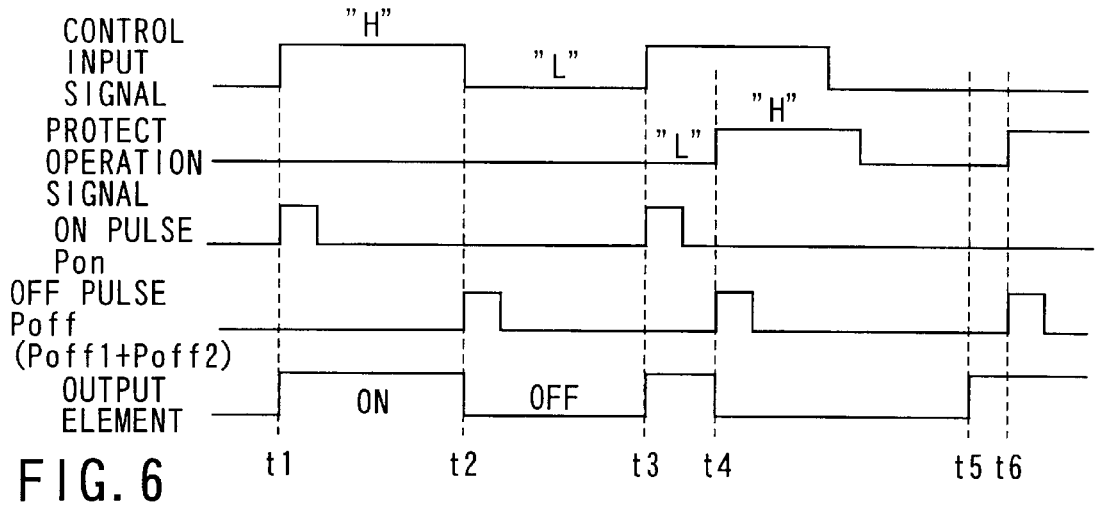
FIG. 6 is a timing chart for explaining operation of the gate driver and power converter shown in FIG. 5.

Next, operation of the gate driver 11 shown in FIG. 5 will be explained with reference to the timing chart shown in FIG. 6. At first, the edge detection circuit 1' detects leading and trailing edges of the control input signal (H: ON command and L: OFF command in FIG. 6). When a leading edge is detected, an ON pulse Pon is generated by the ON pulse generation circuit 2. Similarly, when a trailing edge is detected, an OFF pulse Poff1 is generated by the OFF pulse generation circuit 3. The status hold circuit 4 holds the present status of the gate of the output element 9 (H: gate is on and L: gate is off in FIG. 6) unless the ON pulse Pon or OFF pulse Poff1 are inputted to the circuit. Therefore, as shown in FIG. 6, when the control input signal rises at the timing t1, an ON pulse Pon is generated thereby turning on the output element 9. When the control input signal falls at the timing t2, the OFF pulse Poff1 is generated thereby turning off the output element 9. Explained above is normal operation.

Protect operation will be explained next. When the control input signal rises at the timing t3, an ON pulse Pon is outputted from the ON pulse generation circuit 2, and the output element 9 is driven and turned on by the status hold circuit 4. Thereafter, a protect operation signal (H: protect operation period and L: normal operation period in FIG. 6) is inputted at the timing t4, and then, an OFF pulse Poff2 is generated by the OFF pulse generation circuit 16 and is supplied to the status hold circuit 4. In this manner, the status of the status hold circuit 4 is brought into a gate-off state so that the output element 9 is turned off.

Next explanation will be made of operation in case where the status of the status hold circuit 4 is inverted from a gate-off state to a gate-on state at the timing t5 when the control input signal is at the "L" level. The gate driving status of the output element 9 is inverted at the timing t5. Upon detection of this inversion, a protect operation signal generated at the timing t6. In synchronization with this protect operation signal, an OFF pulse Poff2 is outputted from the OFF pulse generation circuit 16, so that the status of the status hold circuit 4 is inverted from a gate-on state to a gate-off state.

As described above, according to the present embodiment, the gate of the output element 9 can be securely turned off even in case where the output element 9 erroneously maintains the on state. It is therefore possible to eliminate abnormal operation and prevent breakdown of the output element 9.

[Second Embodiment]

Figure 7:
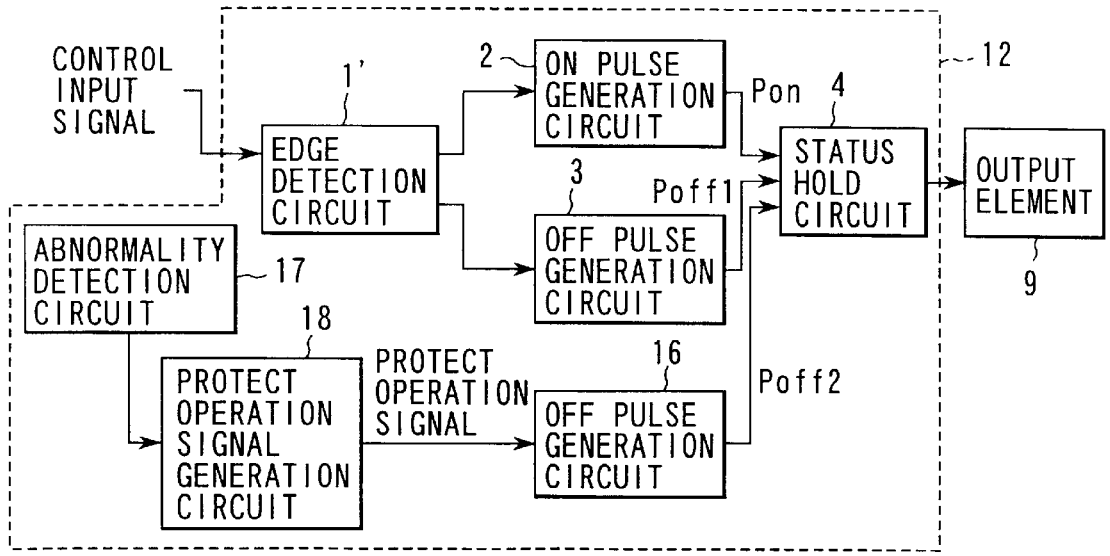
FIG. 7 is a block diagram showing a gate driver and a power converter according to the second embodiment of the present invention.

FIG. 7 is a block diagram showing a gate driver and a power converter according to the second embodiment of the present invention. In this circuit, the gate driver of the first embodiment described above is added with an abnormality detection circuit 17 and a protect operation signal generation circuit 18. That is, the part surrounded by a broken line corresponds to the gate driver 12, and the power converter is constructed by the gate driver 12 and the output element 9.

The abnormality detection circuit 17 serves to detect changes of the power supply voltage, temperature abnormalities such as heating of the output element 9 and the like, and abnormalities in the current such as an excessive current flowing through the output element 9. When an abnormality is detected by the abnormality detection circuit 17, a protect operation signal is outputted from the protect operation signal generation circuit 8. Further, an OFF pulse Poff2 is outputted from the OFF pulse generation circuit 16 in response to this protect operation signal.

In the structure described above, basic drive operation and protect operation of the output element 9 are the same as those of the first embodiment. Since the abnormality detection circuit 17 and the protect operation signal generation circuit 18 are provided in the gate driver 12, it is unnecessary to construct the abnormality detection circuit and the protect signal generation circuit by separate parts. Space saving and cost reduction of the gate driver 12 and the power converter can be achieved.

[Third Embodiment]

Figure 8:
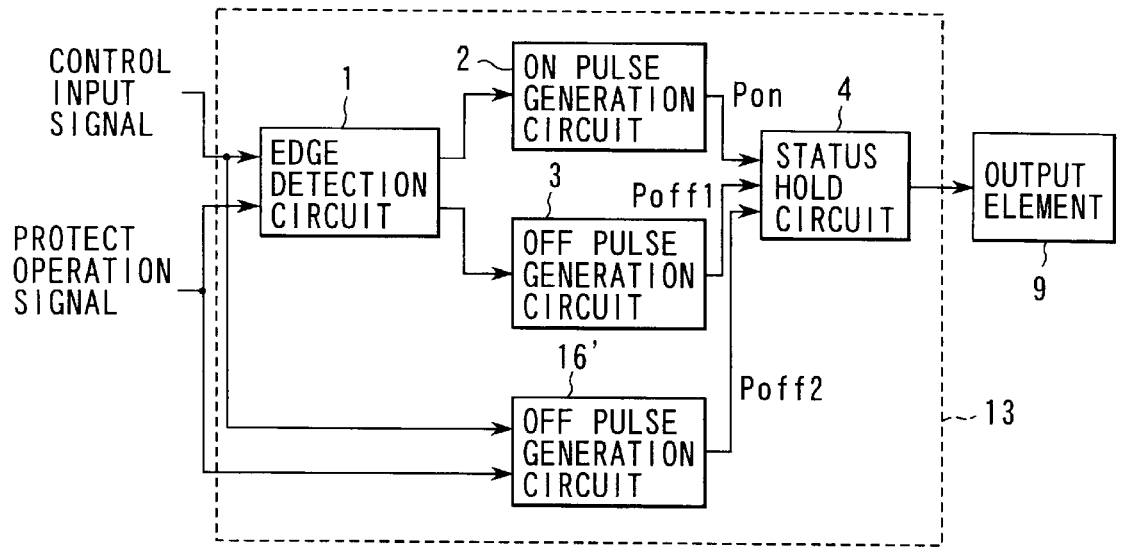
FIG. 8 is a block diagram showing a gate driver and a power converter according to the third embodiment of the present invention.

FIG. 8 is a block diagram showing a gate driver and a power converter according to the second embodiment of the present invention. This gate driver 13 is constructed by an edge detection circuit 1, an ON pulse generation circuit 2, an OFF pulse generation circuit 3, a status hold circuit 4, an output element 9, an OFF pulse generation circuit 16', and the like, in a basically similar manner to the first embodiment. Further, the edge detection circuit 1 is inputted not only with a control input signal but also with a protect operation signal. The OFF pulse generation circuit 16' is inputted not only with a protect operation signal but also with a control input signal.

Figure 1:
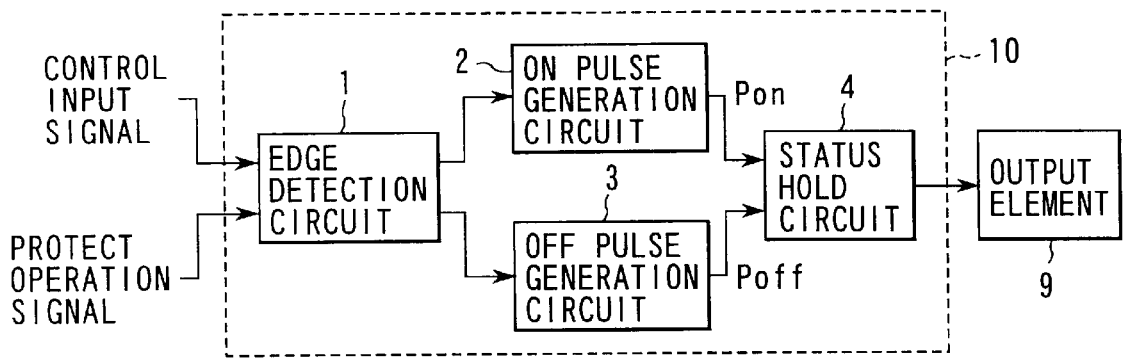
FIG. 1 is a block diagram showing the schematic structure of a conventional gate driver and a conventional power converter.
Figure 2:
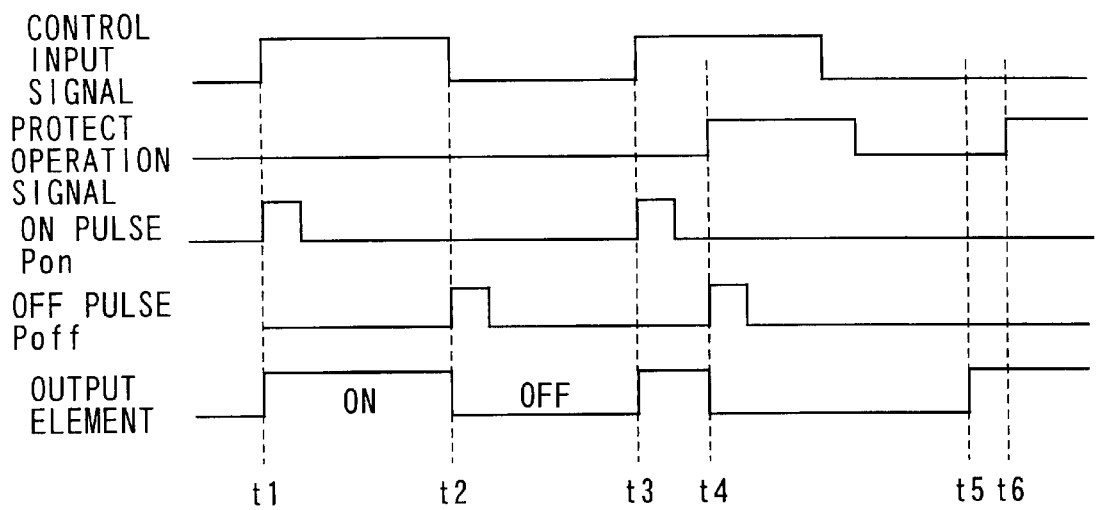
FIG. 2 is a timing chart for explaining operation of the gate driver and power converter shown in FIG. 1.
Figure 4:
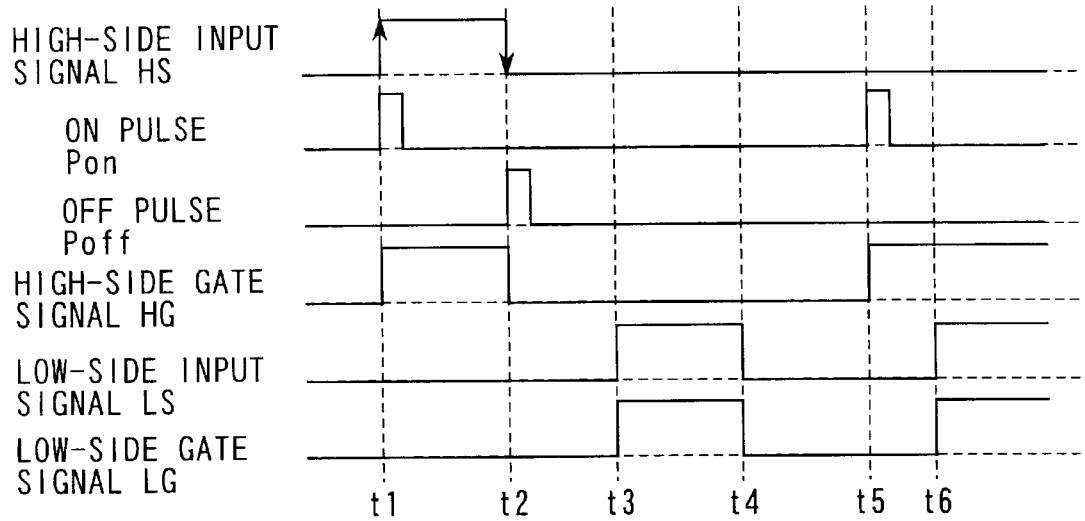
FIG. 4 is a timing chart for explaining operation of the gate driver shown in FIG. 3.

In the structure described above, normal operation is the same as that of the first embodiment. When the protect operation signal goes to the "H" level while the control input signal is at "H" level, an OFF pulse Poff1 is generated by the OFF pulse generation circuit 3 and the output element 9 is turned off, like the conventional gate driver shown in FIG. 1. In contrast, the OFF pulse generation circuit 16' generates an OFF pulse Poff2 only when the protect operation signal goes to the "H" level while the control input signal is at the "L" level.

In the first and second embodiments, the output element 9 is turned off every time when the OFF pulse generation circuit 16 causes an operation error occurs due to noise or the like. Therefore, an operation error may be caused in that an output which should originally be on becomes off. However, according to the present embodiment, the on state of the output element 9 can be maintained when the control input signal is at the "H" level even if the OFF pulse generation circuit 16' causes an operation error due to noise of the like. Therefore, it is possible to improve immunity.

[Fourth Embodiment]

Figure 9:
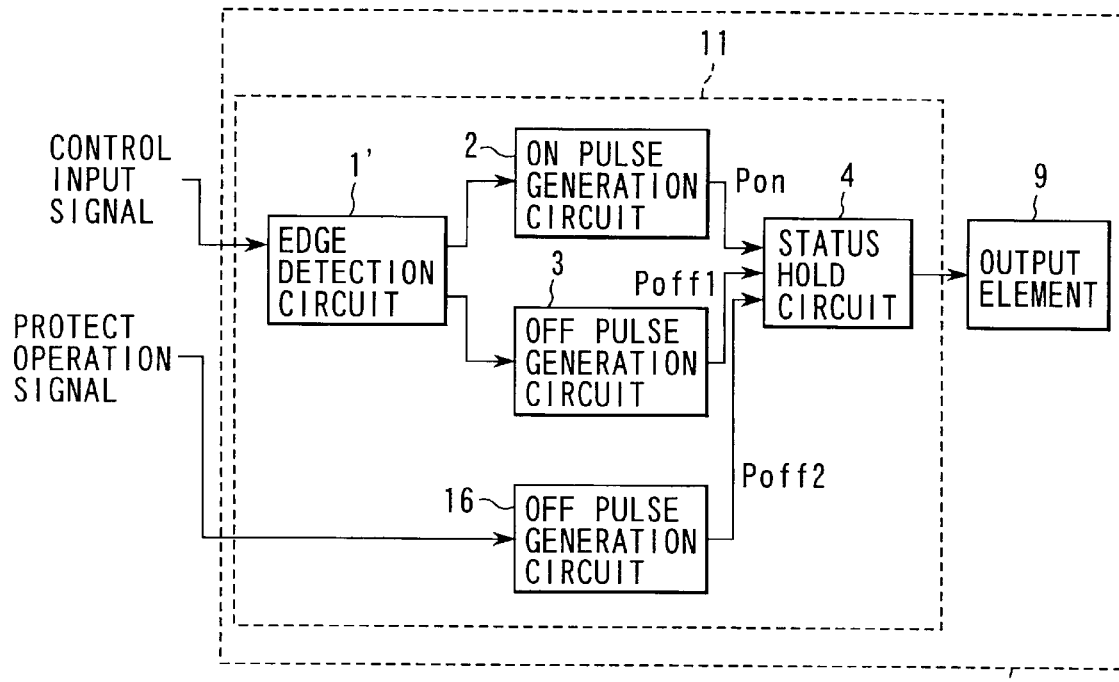
FIG. 9 is a block diagram showing a gate driver and a power converter according to the fourth embodiment of the present invention.

FIG. 9 is a block diagram showing a power converter according to the fourth embodiment of the present invention. A gate driver 11 is constructed in the same circuit structure as the first embodiment as described above. A power converter constructed by the gate driver 11 and an output element 9 is formed and integrated in one chip.

Basic operations of the gate driver 11 and the power converter 20 are the same as those of the first embodiment.

According to the power converter 20 constructed as described above, the gate driver 11 and the output element 9 are formed, integrated in one chip, so that space saving and cost reduction can be achieved.

Of course, the gate drivers 12 and 13 and the output element 9 constructed in the same circuit structure as shown in the second and third embodiments may be integrated in one chip to construct a power converter.

[Fifth Embodiment]

Figure 10:
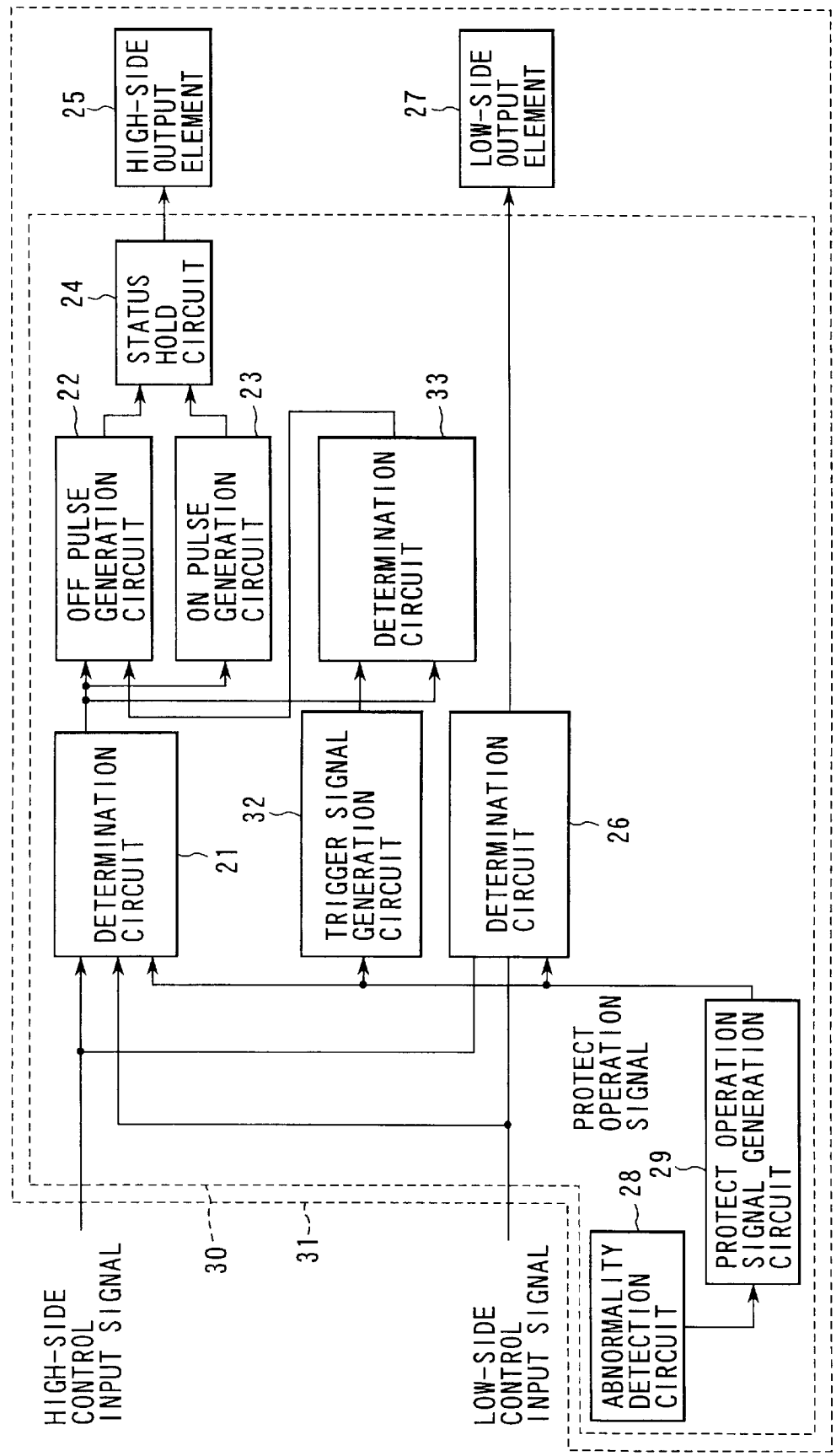
FIG. 10 is a block diagram showing a gate driver and a power converter according to the fifth embodiment of the present invention.

FIG. 10 is a block diagram showing a gate driver and a power converter according to the fifth embodiment of the present invention. This circuit is constructed by a first determination circuit 21, an OFF pulse generation circuit 22, an ON pulse generation circuit 23, a status hold circuit 24, a high-side output element 25, a second determination circuit 26, a low-side output element 27, an abnormality detection circuit 28, a protect operation signal generation circuit 29, a trigger signal generation circuit 32, a third determination circuit 33, and the like. The first determination circuit 21 serves to determine whether a high-side control input signal can be transmitted or not, and the second determination circuit 26 serves to determine whether a low-side control input signal can be transmitted or not. Also, the third determination circuit 33 serves to determine whether a trigger signal for generating a high-side OFF pulse can be transmitted or not in protect operation. Further, the OFF pulse generation circuit 22 detects a trailing edge of a signal and generates an OFF pulse. The ON pulse generation circuit 23 detects a leading edge of a signal and generates an ON pulse.

The abnormality detection circuit 28 serves to detect changes of the power supply voltage, temperature abnormalities such as heating of the output element and the like, and abnormalities in the current such as an excessive current flowing through the output element. When an abnormality is detected by the abnormality detection circuit 28, a protect operation signal is outputted from the protect operation signal generation circuit 29. The trigger signal generation circuit 32 serves to generate a trigger signal for generating a high-side OFF pulse in protect operation.

The part surrounded by a broken line corresponds to a gate driver 30, and a power converter 31 is constructed by the gate driver 30, the high-side output element 25, and the low-side output element 27. This power converter 31 is formed, integrated in one-chip.

In the power converter whose output elements are separate between the high and low sides, the OFF pulse generation circuit 22, ON pulse generation circuit 23, and status hold circuit 24 are required for only the high-side output element 25. This is because the low-side output element 27 is grounded so that the control input signal is reflected on real time.

The first determination circuit 21 is inputted with the control input signal of the high side, the control input signal of the low side, and the protect operation signal outputted from the protect operation signal generation circuit 29. Whether or not the control input signal of the high side can be transmitted is determined from the status of the control input signal of the low side and the protect operation signal. Also, the second determination circuit 26 is inputted with the control input signal of the high side, the control input signal of the low side, and the protect operation signal. From the status of the control input signal of the high side and the protect operation signal, whether or not the control input signal of the low side can be transmitted, and the low-side output element 27 is driven.

The trigger signal generation circuit 32 is inputted with the protect operation signal outputted from the protect operation signal generation circuit 29, and generates a trigger signal for generating a high-side OFF pulse in synchronization with generation of the protect operation signal. This trigger signal and the output signal of the first determination circuit 21 are supplied to the third determination circuit 33. From the status of the high-side control input signal, whether or not the trigger signal can be transmitted is determined, and it is then supplied to the OFF pulse generation circuit 22.

The OFF pulse generation circuit 22 is supplied with an output signal from the first determination circuit 21, detects a trailing edge of the high-side control input signal, generates and supplies an OFF pulse to the status hold circuit 24. This status hold circuit 24 drives and turns on the gate of the high-side output element 25 when an ON pulse is supplied from the ON pulse generation circuit 23. The circuit 24 holds this gate-driving status until an OFF pulse is supplied from the OFF pulse generation circuit 22.

Further, when a change of the power supply voltage, a temperature abnormality such as heating of the output element and the like, and/or an abnormality in the current such as an excessive current flowing through the output element is detected by the abnormality detection circuit 28, a protect operation signal is outputted from the protect operation signal generation circuit 29. By the first determination circuit 21, transmission of a control input signal of the high side is stopped from the status of the control input signal of the low side and the protect operation signal, and driving of the gate of the high-side output element 25 is stopped and turned off. Also, by the second determination circuit 26, transmission of the control input signal of the low side is stopped from the status of the control input signal of the high side and the protect operation signal, and the low side output element 27 is turned off.

According to this structure, when the high-side output element 25 is turned on due to some reason while the control input signal is in the off status ("L" level), a trigger signal is outputted from the third determination circuit 33 in response to input of a protect operation signal, thereby to control the OFF pulse generation circuit 22, even if the control input signal of the high side is at "L" level and no trailing edge exists. In this manner, the high-side output element 25 can be turned off. Therefore, even if the high-side output element 25 erroneously holds on-status in case where the output elements are separate between the high and low sides, abnormal operation can be eliminated so that the high-side output element 25 is prevented from breaking down.

In addition, an abnormality detection circuit 28 and a protect operation signal generation circuit 29 are provided in the gate driver 30. Therefore, it is unnecessary to construct an abnormality detection circuit or a protect operation signal generation circuit by an externally attached circuit. Space saving and cost reduction can hence be achieved.

Further, the gate driver 30, high-side output element 25, and low-side output element 27 are formed in one-chip, space saving and cost reduction of the power converter 31 can be achieved.

[Sixth Embodiment]

Figure 11:
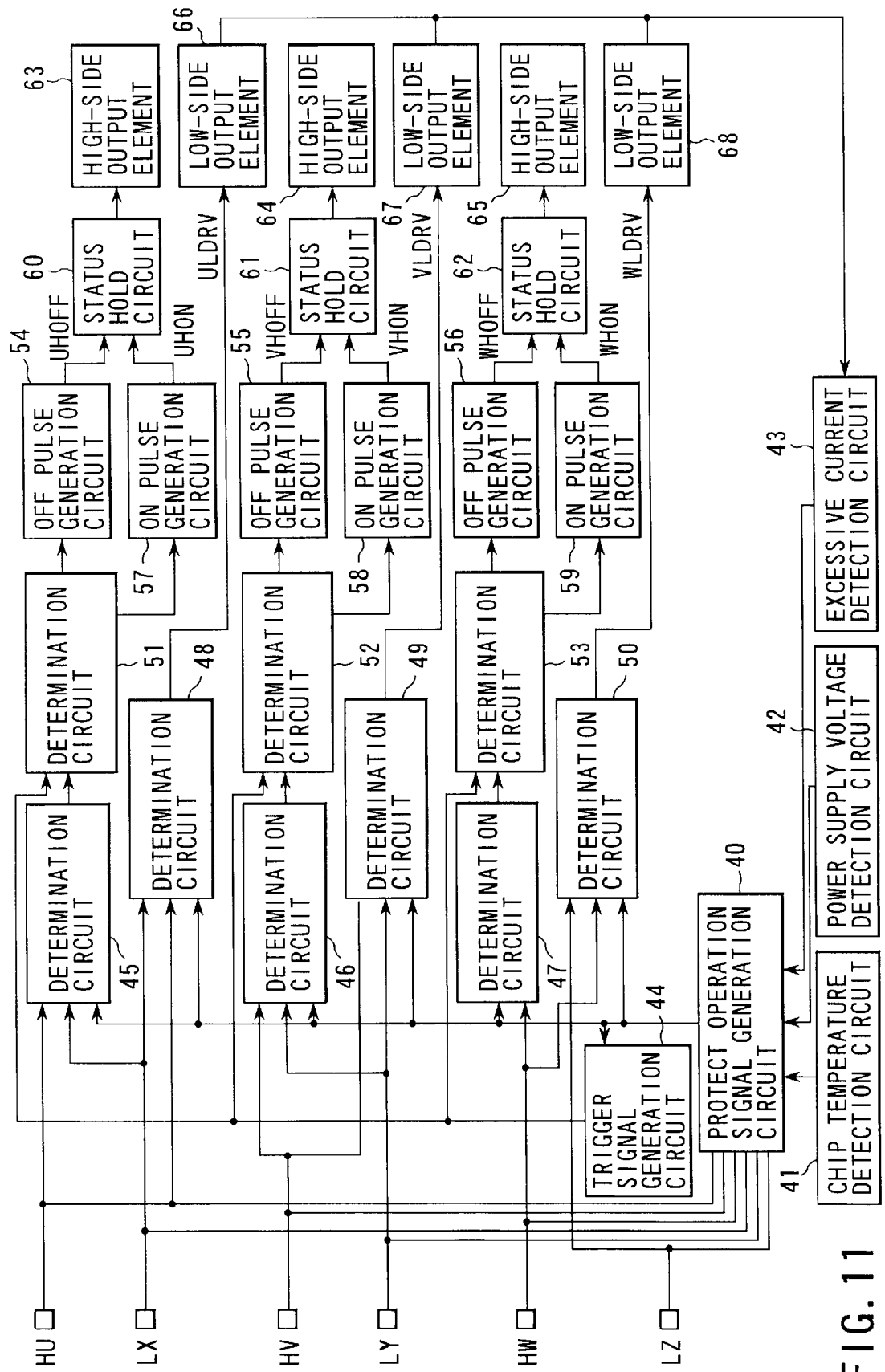
FIG. 11 is a block diagram showing a gate driver and a power converter according to the sixth embodiment of the present invention.
Figure 12:
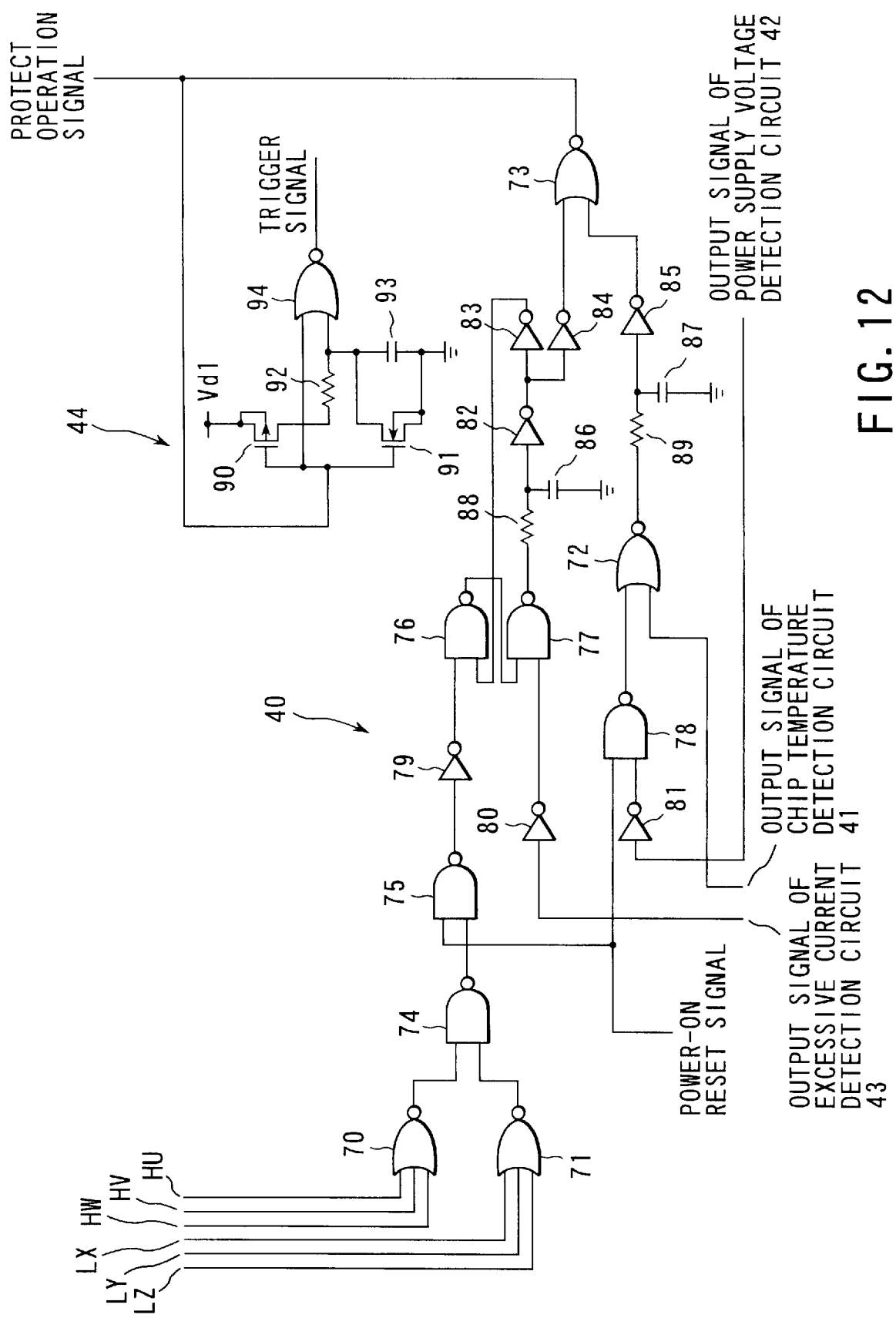
FIG. 12 is a circuit diagram showing a specific structural example of a protect operation signal generation circuit and a trigger signal generation circuit in the circuit shown in FIG. 11.
Figure 13A:
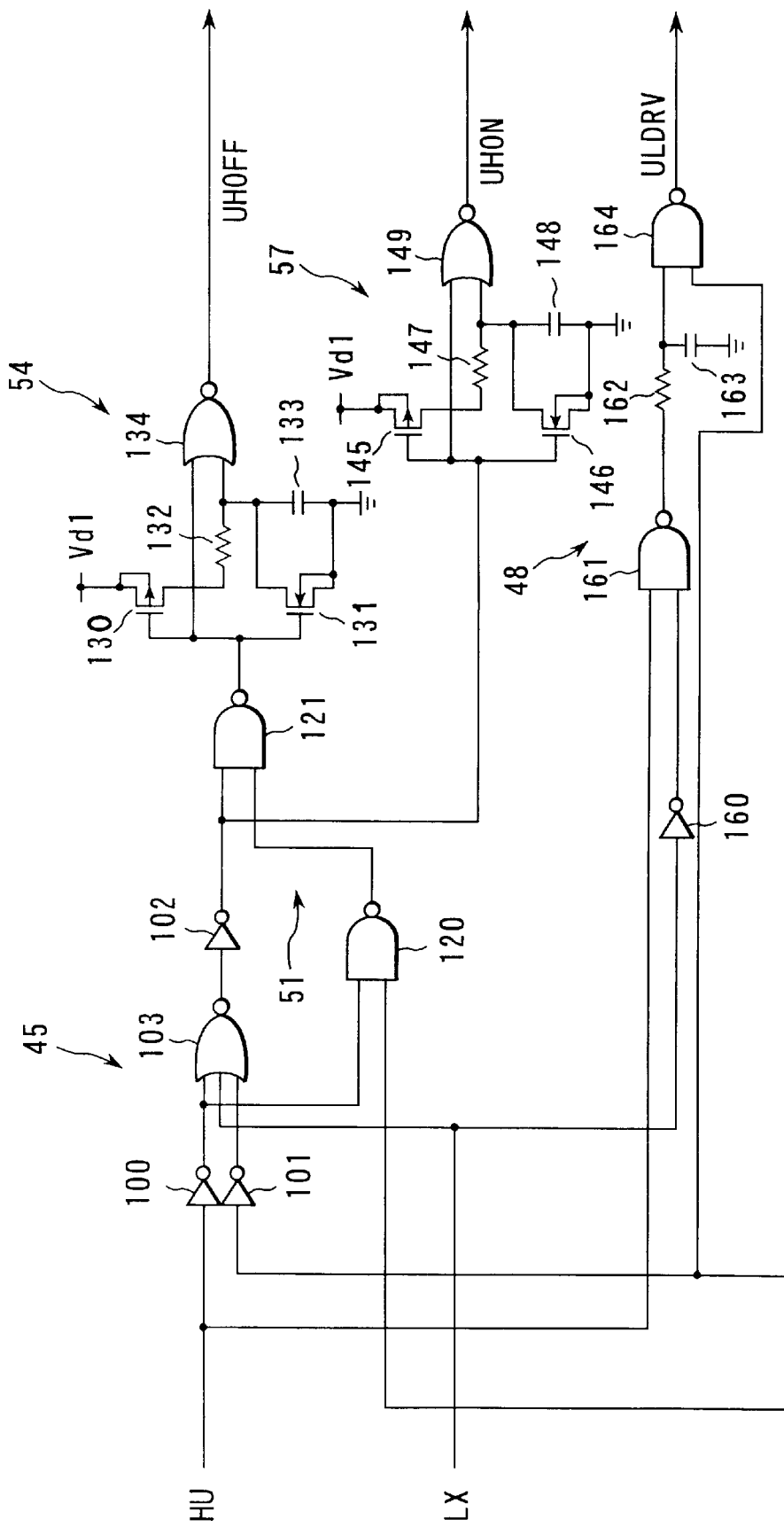
FIGS. 13A to 13C are circuit diagrams showing a specific structural example of a determination circuit of the high side, a determination circuit for determining whether a trigger signal is transmissible or not, an OFF pulse generation circuit, an ON pulse generation circuit, and a determination circuit of the low side.
Figure 13B:
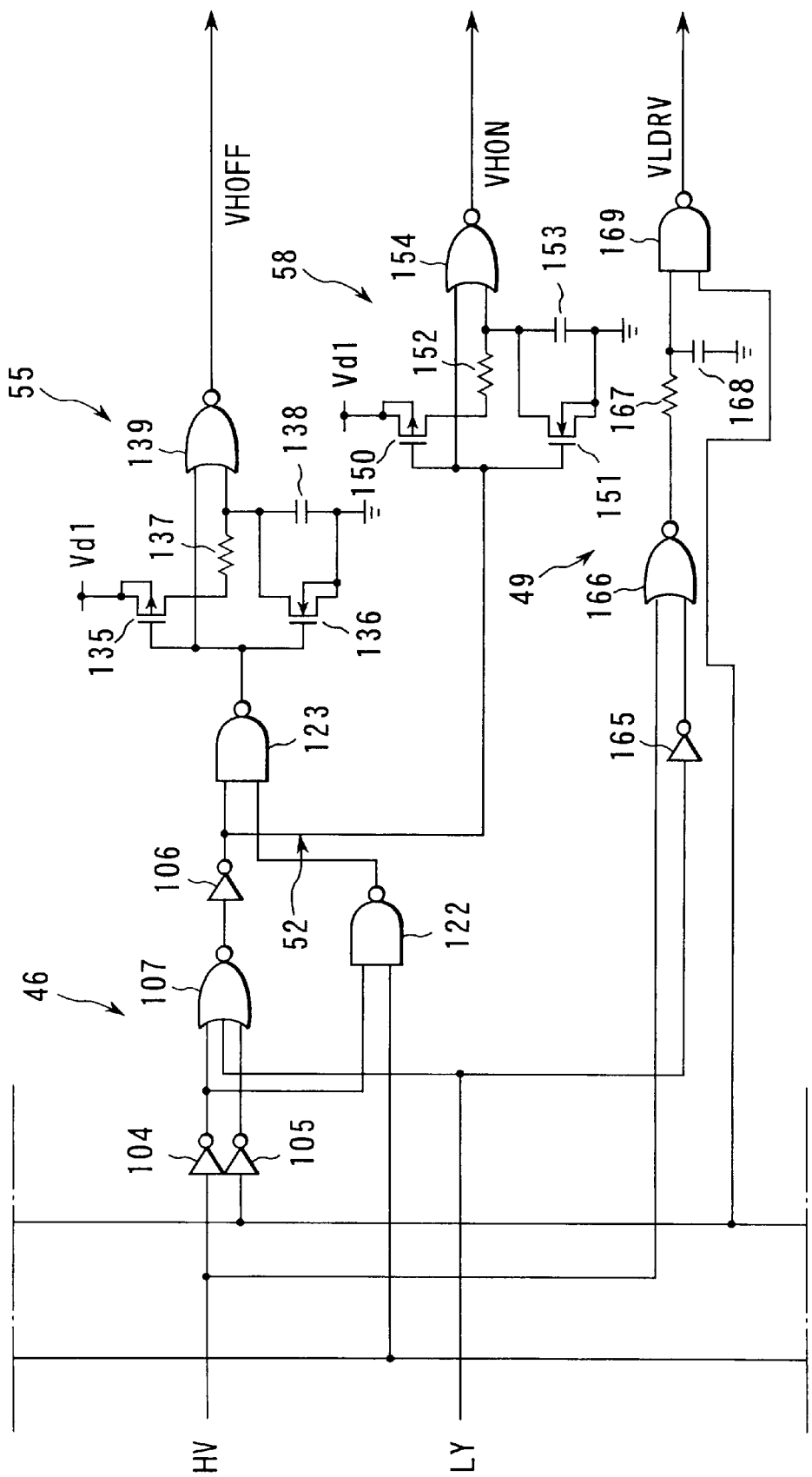
Figure 13C:
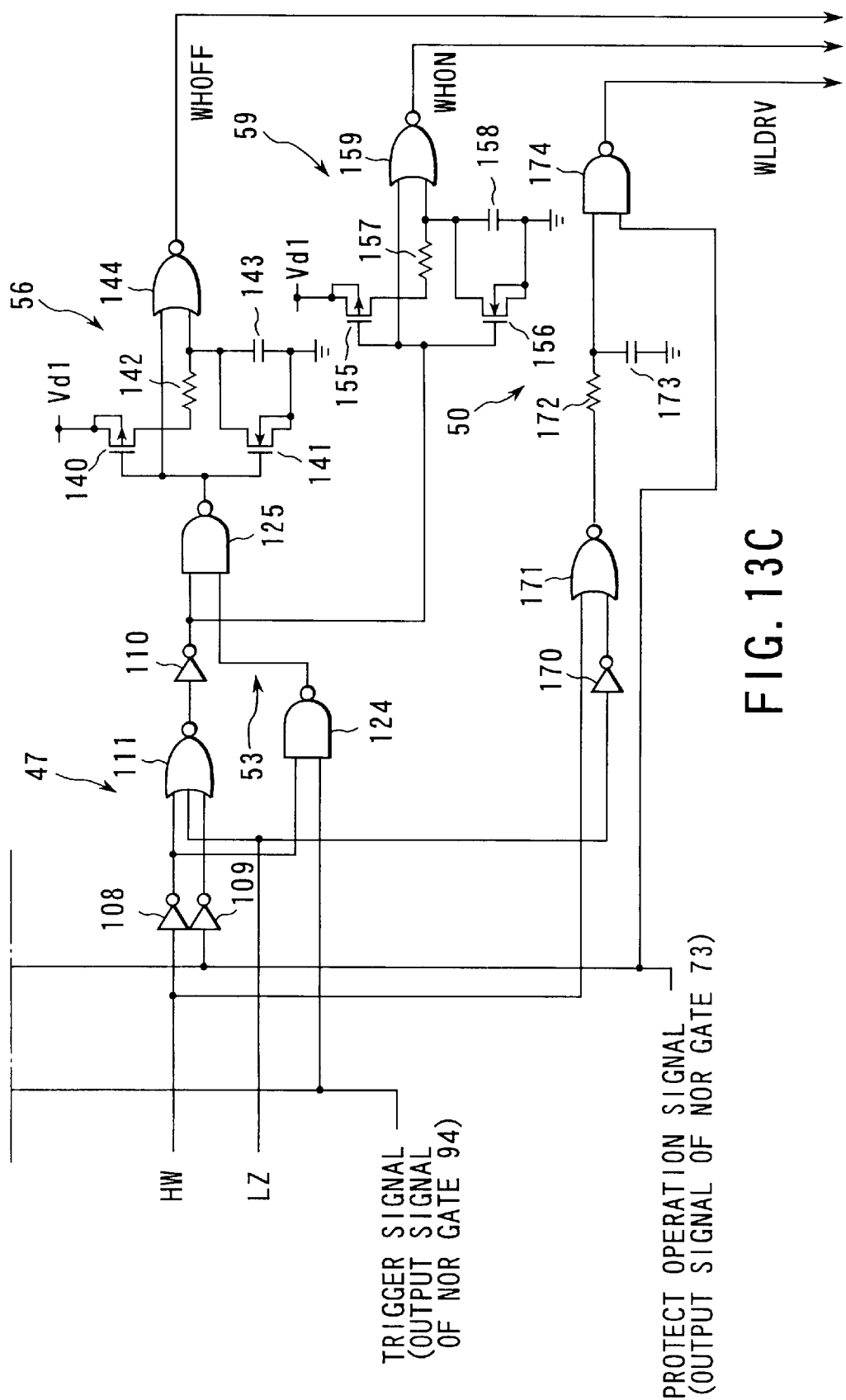

FIGS. 11, 12, 13A, 13B and 13C are explanatory views for a gate driver and a power converter according to the sixth embodiment of the present invention. FIG. 11 is a block diagram showing the schematic structure thereof. FIG. 12 is a circuit diagram showing a specific structural example of a protect operation signal generation circuit and a high-side OFF pulse generation trigger signal generation circuit for protect operation in the circuit shown in FIG. 11. FIGS. 13A to 13C are circuit diagrams showing a specific structural example of the first to third determination circuits, an OFF pulse generation circuit, and an ON pulse generation circuit.

The sixth embodiment shows an example of three-phase driving, and output elements of each of the phases (U-phase, V-phase, and W-phase) are separate between low and high sides. As shown in FIG. 11, the protect operation signal generation circuit 40 is supplied with high-side control input signals HU, HV, and HW, low-side control input signals LX, LY, and LZ, an output signal of a chip temperature detection circuit 41, an output of a power supply voltage detection circuit 42, an output signal of an excessive current detection circuit 43, and the like. The chip temperature detection circuit 41 detects the temperature of the chip to determine excessively-heated status. The power supply voltage detection circuit 42 detects lowering of the power supply voltage. Also, the excessive current detection circuit 43 detects an excessive current which flows through the output elements. These detection circuits 41, 42, and 43 operate as abnormality detection circuits.

When an increase of the chip temperature, a decrease of the power supply voltage, or an abnormal state such as an excessive current flowing through an output element or the like is detected by each of the detection circuits 41, 42, and 43, a protect operation signal is outputted from the protect operation signal generation circuit 40. This protect operation signal is supplied to each of the trigger signal generation circuit 44, first determination circuits 45, 46, and 47 of the respective phases, and second determination circuits 48, 49, and 50 of the respective phases.

The first determination circuit 45 is inputted with the high-side control input signal HU and the low-side control input signal LX in addition to the protect operation signal. The first determination circuit 46 is inputted with the high-side control input signal HV and the low-side control input signal LY in addition to the protect operation signal. The first determination circuit 47 is inputted with the high-side control input signal HW and the low-side control input signal LZ in addition to the protect operation signal. Meanwhile, the second determination circuit 48 is inputted with the low-side control input signal LX and the high-side control input signal HU in addition to the protect operation signal. The second determination circuit 49 is inputted with the low-side control input signal LY and the high-side control input signal HV in addition to the protect operation signal. The second determination circuit 50 is inputted with the low-side control input signal LZ and the high-side control input signal HW in addition to the protect operation signal.

Output signals of the first determination circuits 45, 46, and 47 of the three phases are respectively supplied to the determination circuits 51, 52, and 53 of the three phases. An output signal of the trigger signal generation circuit 44 is supplied to each of the third determination circuits 51, 52, and 53. An output signal of the determination circuit 51 is supplied to the OFF pulse generation circuit 54 and ON pulse generation circuit 57. An output signal of the determination circuit 52 is supplied to the OFF pulse generation circuit 56 and ON pulse generation circuit 59. An output signal of the determination circuit 53 is supplied to the OFF pulse generation circuit 56 and the ON pulse generation circuit 59. An output signal UHOFF of the OFF pulse generation circuit 54 and an output signal UHON of the ON pulse generation circuit 55 are supplied to the status hold circuit 60. An output signal VHOFF of the OFF pulse generation circuit 55 and an output signal VHON of the ON pulse generation circuit 58 are supplied to the status hold circuit 61. Further, an output signal WHOFF of the OFF pulse generation circuit 56 and an output signal WHON of the ON pulse generation circuit 59 are supplied to the status hold circuit 62. Further, the high-side output elements 63, 64, and 65 are driven respectively by the output signals of the status hold circuits 60, 61, and 62.

Meanwhile, the low-side output elements 66, 67, and 68 are driven by the output signals of the second determination circuits of the respective phases. These low-side output elements 66, 67, and 68 are provided with a sensing element for detecting an excessive current, and the output of the sensing element is supplied to the excessive current detection circuit 43, thereby to detect whether or not an excessive current flows.

The protect operation signal generation circuit 40 is constructed by NOR gates 70 to 73, NAND gates 74 to 78, inverters 79 to 85, capacitors 86 to 87, and resistors 88 to 89. Input terminals of the NOR gate 70 is supplied with the high-side control input signals HU, HV, and HW, and input terminals of the NOR gate 71 is supplied with the low-side control input signals LX, LY, and LZ. Output signals of the NOR gates 70 and 71 are supplied to both input terminals of the NAND gate 74, and an output signal of the NAND gate 74 is supplied to one input terminal of the NAND gate 75. The other input terminal of the NAND gate 75 is supplied with a power-on reset signal from an internal power supply circuit not shown. An output signal of the NAND gate 75 is supplied to one input terminal of the NAND gate 76 through an inverter 79. An output signal of the NAND gate 76 is supplied to one input terminal of the NAND gate 77. The other input terminal of the NAND gate 77 is supplied with an output signal of the excessive current detection circuit 43 through the inverter 80. An output terminal of the NAND gate 77 is connected with one end of the resistor 88. The other end of this resistor 88 is connected with an input terminal of the inverter 82. A capacitor 88 is connected between the other end of this resistor 88 and a ground point. An output signal of the inverter 82 is supplied to the other input terminal of the NAND gate 76 through the inverter 83 and is also supplied to an input terminal of the NOR gate 73 through the inverter 84. The power-on reset signal is supplied to one input terminal of the NAND gate 78, and the other input terminal thereof is supplied with an output signal of the power supply voltage detection circuit 42 through the inverter 81. An output signal of the NAND gate 78 is supplied to one input terminal of the NOR gate 72. The other input terminal of the NOR gate 72 is supplied with an output signal of the chip temperature detection circuit 41. An output terminal of the NOR gate 72 is connected with one end of the resistor 89. The other end of this resistor 89 is connected with an input terminal of the inverter 85. The capacitor 87 is connected between the other end of the resistor 89 and a ground point. An output signal of the inverter 85 is supplied to the other input terminal of the NOR gate 73. Further, a protect operation signal is outputted from the output terminal of this NOR gate 73.

Also, the trigger signal generation circuit 44 is constructed by a P-channel type MOS transistor 90, a N-channel type MOS transistor 91, a resistor 92, a capacitor 93, a NOR gate 94, and the like. A protect operation signal outputted from the NOR gate 73 is supplied to the gates of the MOS transistors 90 and 91, and one input terminal of the NOR gate 94. The source and back gate of the MOS transistor 90 are connected to a power supply Vd1, and the drain thereof is connected to one end of the resistor 92. The drain of the MOS transistor 91 is connected to the other end of the resistor 92 and the other input terminal of the NOR gate 94, and the source and back gate thereof are grounded. The capacitor 93 is connected between the source and drain of the MOS transistor 91. Further, the output signal of the NOR gate 94 is supplied as an output signal (trigger signal) of the trigger signal generation circuit 44 to the third determination circuits 51, 52, and 53 of the respective phases.

As shown in FIGS. 13A to 13C, the determination circuit 45 is constructed by inverters 100 to 102 and a NOR gate 103. An input terminal of the inverter 100 is supplied with the high-side control input signal HU, and an output signal of the inverter 100 is supplied to a first input terminal of the NOR gate 103. An input terminal of the inverter 101 is supplied with the protect operation signal (output signal of the NOR gate 73), and an output signal of this inverter 101 is supplied to a second input terminal of the NOR gate 103. A third input terminal of this NOR gate 103 is supplied with a low-side control input signal LX, and an output thereof is supplied to an input terminal of the inverter 102.

Likewise, the determination circuit 46 is constructed by inverters 104 to 106 and a NOR gate 107. An input terminal of the inverter 104 is supplied with the high-side control input signal HV, and an output signal of this inverter 104 is supplied to a first input terminal of the NOR gate 107. An input terminal of the inverter 105 is supplied with the protect operation signal, and an output signal of the inverter 105 is supplied to a second input terminal of the NOR gate 107. A third input terminal of this NOR gate 107 is supplied with the low-side control input signal LY, and an output thereof is supplied to an input terminal of the inverter 106.

Also, the determination circuit 47 is constructed by inverters 108 to 110 and a NOR gate 111. An input terminal of the inverter 108 is supplied with the control input signal HW of the high side, and an output signal of this inverter 108 is supplied to a first input terminal of the NOR gate 111. An input terminal of the inverter 109 is supplied with the protect operation signal, and an output signal of this inverter 109 is supplied to a second input terminal of the NOR gate 111. A third input terminal of this NOR gate 111 is supplied with the low-side control input signal LZ, and an output thereof is supplied to an input terminal of the inverter 110.

The determination circuit 51 is constructed by NAND gates 120 and 121. One input terminal of the NAND gate 120 is supplied with an output signal of the inverter 100, and the other input terminal thereof is inputted with a trigger signal outputted from the trigger signal generation circuit 44 (which is an output signal of the NOR gate 94). An output signal of this NAND gate 120 is supplied to one input terminal of the NAND gate 121. The other input terminal of this NAND gate 121 is supplied with an output signal of the inverter 102.

Similarly, the determination circuit 52 is constructed by NAND gates 122 and 123. One input terminal of the NAND gate 122 is supplied with an output signal of the inverter 104, and the other input terminal thereof is inputted with the trigger signal. An output signal of this NAND gate 122 is supplied to one input terminal of the NAND gate 123. The other input terminal of this NAND gate 123 is supplied with an output signal of the inverter 106.

Further, the determination circuit 53 is constructed by NAND gates 124 and 125. One input terminal of the NAND gate 124 is supplied with an output signal of the inverter 108, and the other input terminal thereof is inputted with the trigger signal. An output signal of this NAND gate 124 is supplied to one input terminal of the NAND gate 125. The other input terminal of this NAND gate 125 is supplied with an output signal of the inverter 110.

The OFF pulse generation circuit 54 is constructed by a P-channel type MOS transistor 130, a N-channel type MOS transistor 131, a resistor 132, a capacitor 133, and a NOR gate 134. The source of the MOS transistor 130 is connected to the power supply Vd1, the drain thereof is connected to one end of the resistor 132, and the gate thereof is connected to an output terminal of the NAND gate 121. The drain of the MOS transistor 131 is connected to the other end of the resistor 132, the source thereof is grounded, and the gate thereof is connected to an output terminal of the NAND gate 121. The capacitor 133 is connected between the drain and source of the MOS transistor 131. One input terminal of the NOR gate 134 is connected to the output terminal of the NAND gate 121, and the other input terminal thereof is connected to the other end of the resistor 132. Further, an output signal UHOFF of this NOR gate 134 is supplied to a status hold circuit 60.

Similarly, the OFF pulse generation circuit 55 is constructed by a P-channel type MOS transistor 135, a N-channel type MOS transistor 136, a resistor 137, a capacitor 138, and a NOR gate 139. The source of the MOS transistor 135 is connected to the power supply Vd1, the drain thereof is connected to one end of the resistor 137, and the gate thereof is connected to an output terminal of the NAND gate 123. The drain of the MOS transistor 136 is connected to the other end of the resistor 137, the source thereof is grounded, and the gate thereof is connected to the output terminal of the NAND gate 123. The capacitor 138 is connected between the drain and source of the MOS transistor 136. One input terminal of the NOR gate 139 is connected to the output terminal of the NAND gate 123, and the other input terminal thereof is connected to the other end of the resistor 137. Further, an output signal VHOFF of this NOR gate 139 is supplied to a status hold circuit 61.

Also, the OFF pulse generation circuit 56 is constructed by a P-channel type MOS transistor 140, a N-channel type MOS transistor 140, a resistor 142, a capacitor 143, and a NOR gate 144. The source of the MOS transistor 140 is connected to the power supply Vd1, the drain thereof is connected to one end of the resistor 142, and the gate thereof is connected to an output terminal of the NAND gate 125. The drain of the MOS transistor 141 is connected to the other end of the resistor 142, the source thereof is grounded, and the gate thereof is connected to the output terminal of the NAND gate 125. The capacitor 143 is connected between the drain and source of the MOS transistor 141. One input terminal of the NOR gate 144 is connected to the output terminal of the NAND gate 125, and the other input terminal thereof is connected to the other end of the resistor 142. Further, an output signal WHOFF of this NOR gate 144 is supplied to a status hold circuit 62.

The ON pulse generation circuit 57 is constructed by a P-channel type MOS transistor 145, a N-channel type MOS transistor 146, a resistor 147, a capacitor 148, and a NOR gate 149. The source of the MOS transistor 145 is connected to the power supply Vd1, the drain thereof is connected to one end of the resistor 147, and the gate thereof is connected to an output terminal of the inverter 102. The drain of the MOS transistor 146 is connected to the other end of the resistor 147, the source thereof is grounded, and the gate thereof is connected to the output terminal of the inverter 102. The capacitor 148 is connected between the drain and source of the MOS transistor 146. One input terminal of the NOR gate 149 is connected to the output terminal of the inverter 102, and the other input terminal thereof is connected to the other end of the resistor 147. Further, an output signal UHON of this NOR gate 149 is supplied to the status hold circuit 60.

Similarly, the ON pulse generation circuit 58 is constructed by a P-channel type MOS transistor 150, a N-channel type MOS transistor 151, a resistor 152, a capacitor 153, and a NOR gate 154. The source of the MOS transistor 150 is connected to the power supply Vd1, the drain thereof is connected to one end of the resistor 152, and the gate thereof is connected to an output terminal of the inverter 106. The drain of the MOS transistor 151 is connected to the other end of the resistor 152, the source thereof is grounded, and the gate thereof is connected to the output terminal of the inverter 106. The capacitor 153 is connected between the drain and source of the MOS transistor 151. One input terminal of the NOR gate 154 is connected to the output terminal of the inverter 106, and the other input terminal thereof is connected to the other end of the resistor 152. Further, an output signal VHON of this NOR gate 154 is supplied to the status hold circuit 61.

Further, the ON pulse generation circuit 59 is constructed by a P-channel type MOS transistor 155, a N-channel type MOS transistor 156, a resistor 157, a capacitor 158, and a NOR gate 159. The source of the MOS transistor 155 is connected to the power supply Vd1, the drain thereof is connected to one end of the resistor 157, and the gate thereof is connected to an output terminal of the inverter 110. The drain of the MOS transistor 156 is connected to the other end of the resistor 157, the source thereof is grounded, and the gate thereof is connected to the output terminal of the inverter 110. The capacitor 158 is connected between the drain and source of the MOS transistor 156. One input terminal of the NOR gate 159 is connected to the output terminal of the inverter 110, and the other input terminal thereof is connected to the other end of the resistor 157. Further, an output signal WHON of this NOR gate 159 is supplied to the status hold circuit 62.

The determination circuit 48 is constructed by an inverter 160, a NOR gate 161, a resistor 162, a capacitor 163, and a NAND gate 164. One input terminal of the NOR gate 161 is supplied with a high-side control input signal HU, and the other input terminal thereof is supplied with a low-side control input signal LX through the inverter 160. One output terminal of the NOR gate 161 is connected with one end of the resistor 162. The other end of this resistor 162 is connected with one input terminal of the NAND gate 164, and the capacitor 163 is connected between the other end of the resistor 162 and a ground point. The other input terminal of the NAND gate 164 is supplied with a protect operation signal, and a signal ULDRV for driving the low-side output element 66 is outputted from the output terminal of this NAND gate 164.

Similarly, the determination circuit 49 is constructed by an inverter 165, a NOR gate 166, a resistor 167, a capacitor 168, and a NAND gate 169. One input terminal of the NOR gate 166 is supplied with a high-side control input signal HV, and the other input terminal thereof is supplied with a low-side control input signal LY through the inverter 165. An output terminal of the NOR gate 166 is connected with one end of the resistor 167. The other end of this resistor 167 is connected with one input terminal of the NAND gate 169. The capacitor 168 is connected between the other end of the resistor 167 and a ground point. The other input terminal of the NAND gate 169 is supplied with a protect operation signal, and a signal VLDRV for driving the low-side output element 67 is outputted from the output terminal of this NAND gate 169.

Also, the determination circuit 50 is constructed by an inverter 170, a NOR gate 171, a resistor 172, a capacitor 173, and a NAND gate 174. One input terminal of the NOR gate 171 is supplied with a high-side control input signal HW, and the other input terminal thereof is supplied with a low-side control input signal LZ through the inverter 170. An output terminal of the NOR gate 171 is connected with one end of the resistor 172. The other end of this resistor 172 is connected with one input terminal of the NAND gate 174. The capacitor 173 is connected between the other end of the resistor 172 and a ground point. The other input terminal of the NAND gate 174 is supplied with a protect operation signal, and a signal WLDRV for driving the low-side output element 68 is outputted from the output terminal of this NAND gate 174.

In the gate driver and power coverter according to the present embodiment, the circuit of the fifth embodiment shown i FIG. 10 is expanded to adopt three-phase driving, and basic operation of the present embodiment is substantially the same as that of the fifth embodiment.

According to the structure as described above, it is possible to output an OFF pulse from the OFF pulse generation circuit and to turn off the output element, in response to an input of a protect operation signal, when an output element is turned on due to some reason while the high-side control input signal is off in case where three-phase driving is adopted and output elements are separate between hign and low sides. Therefore, abnormal operation can be eliminated so that the output elements 63, 64, qand 65 can be prevented from breaking down, in case where the high-side output elements 63, 64, and 65 erroneously hold on-status.

In addition, since the chip temperature detection circuit 41, power supply voltage detection circuit 42, excessive current detection circuit 43, and protect operation signal generation circuit 40 are provided in the gate driver, it is unnecessary to add and external circuit, and thus, space saving and cost reduction can be achieved.

Further, if the gate driver, high-side output elements 63, 64, and 65, and low-side output elements 66, 67. and 68 are formed in one-chip, space saving and cost reduction of the power converter can be achieved.

[Seventh Embodiment]

Figure 14:
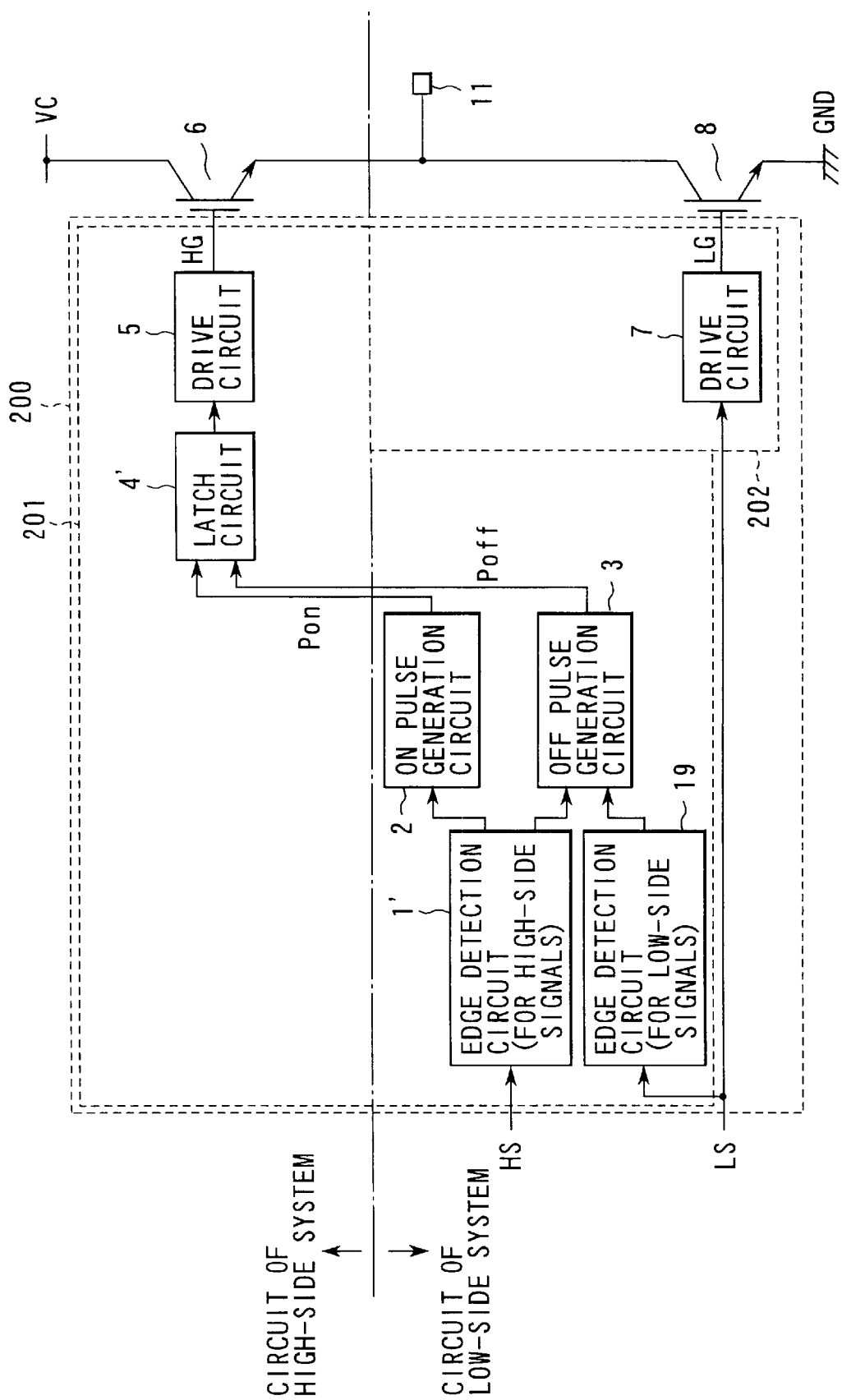
FIG. 14 is a block diagram showing a gate driver according to seventh embodiment of the present invention.

FIG. 14 is a circuit diagram showing a structural example of a gate driver according to the seventh embodiment of the present invention. In this gate driver 200, switching elements (which are power MOSFETs, IGBTs, or the like: IGBTs in this case) 6 and 8 having a push/pull structure are controlled by supplying a drive signal to the gates of these switching elements. The gate driver 200 comprises a high-side gate driver circuit 201 for controlling the high-side switching element 6 to turn on/off, and a low-side gate driver circuit 202 for controlling the low-side switching element 8 to tun on/off. The high-side gate driver circuit 201 is constructed by a first and second edge detection circuits 1' and 19 for the high and low sides, an ON pulse generation circuit 2, an OFF pulse generation circuit 3, a latch circuit 4', a drive circuit 5, and the like. In addition, the low-side gate driver circuit 202 is constructed, including a driver circuit 7.

In the gate driver 200, the switching elements 6 and 8 for the high and low sides are respectively controlled with their own operation voltages. Therefore, the circuit of the high-side system and the circuit of the low-side system are operated with reference potentials different from each other, respectively. The edge detection circuits 1' and 19, ON pulse generation circuit 2, and OFF pulse generation circuit 3 in the high-side gate driver circuit 201 are respectively formed by circuits of the low-side syste,. The latch circuit 4' and the drive circuit 5 are formed by circuits of the high-side system. Also, the drive circuit 7 is formed by a circuit of the low-side system. Further, the high-side input signal HS and the low-side input signal LS are inputted as signals based on the reference potential of the low-side system.

Figure 3:
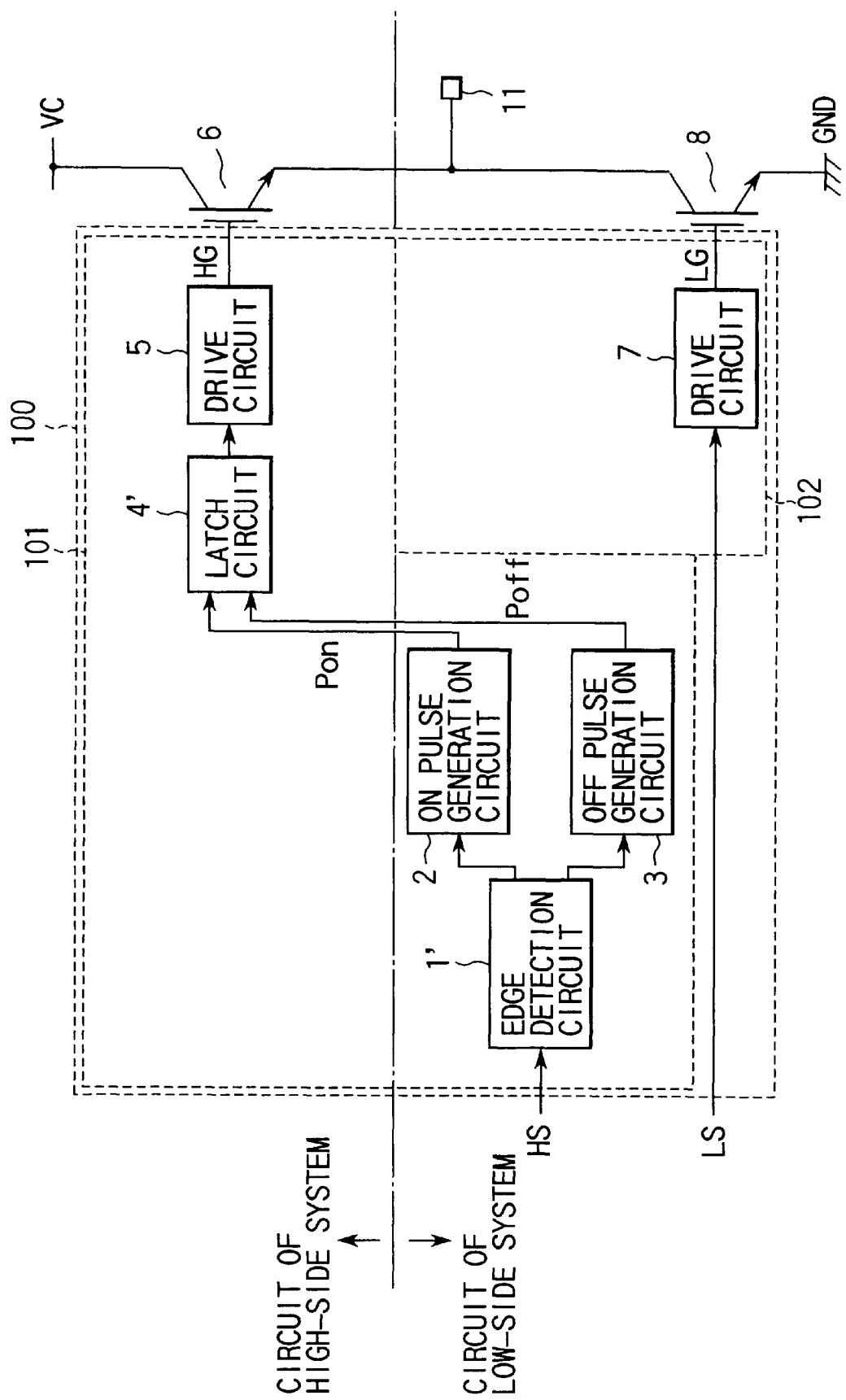
FIG. 3 is a circuit diagram showing another structural example of a conventional gate driver.

That is, in the gate driver according to the seventh embodiment, an edge detection circuit 19 for a low-side signal is added to the gate driver 100 shown in FIG. 3. Leading and trailing edges of the low-side input signal LS are detected, and detection outputs are supplied to the OFF pulse generation circuit 3.

The high-side input signal HS is supplied to an edge detection circuit 1' for high-side signals, and a detection output from the edge detection circuit 1' is supplied to the ON pulse generation circuit 2 and the OFF pulse generation circuit 3. In addition, the low-side input signal LS is supplied to the edge detection output from this edge detection circuit 19 is supplied to the OFF pulse generation circuit 3. The ON pulse generation circuit 2 generates a leading edge of the high-side input signal HS detected by the edge detection circuit 1'. Also, the OFF pulse generation circuit 3 generates an OFF pulse Poff in response to a trailing edge of the high-side input signal HS detected by the edge detection circuit 1' and a leading edge of the low-side input signal LS. The ON pulse Pon outputted from the ON pulse generation circuit 2 and the OFF pulse Poff outputted from the OFF pulse generation circuit 3 are each supplied to the latch circuit 4', and ON/OFF information is held. Further, based on the ON/OFF information held by the latch circuit 4', the high-side gate signal HG outputted from the drive circuit 5 is supplied to the gate of the high-side switching element 6, so the element 6 is driven.

Meanwhile, the low-side input signal LS is supplied not only to the edge detection circuit 19 but also to the drive circuit 7. The low-side gate signal LG outputted from this drive circuit 7 is supplied to the gate of the low-side switching element 8 and drives this element. In this manner, the low-side switching element 8 is driven in response to the low-side input signal LS.

The high-side switching element 6 and the low side switching element 8 are constructed in a push/pull structure, and the collector and emitter of the high-side switching element 6 are respectively connected to the power supply VC and the output terminal 11. The collector and emitter of the low-side switching element 8 are respectively connected to the output terminal 11 and a ground point GND.

Although not shown in the figure, an excessive current protect circuit for preventing an excessive current from flowing through the switching elements 6 and 8, a circuit for detecting a change of the power supply voltage, a circuit for detecting a temperature abnormality. such as heat of switching elements 6 and 8, and the like are provided in the gate driver. Further, protect operation is carried out when an abnormality is detected in these circuits.

Next, explanation will be made of operation in the structure as described above, with reference to the timing chart shown in FIG. 15. At first, processing on the high-side input HS is carried out as follows. When a high-side input signal HS is inputted to the edge detection circuit (for high-side signals) 1', leading and trailing edges are detected. An ON pulse Pon is generated from the ON pulse generation circuit 2 (at the timing t1), in response to the leading edge of the high-side input signal HS, and an OFF pulse generation circuit 3, in response to the trailing edge.

The signal transmitted as a pulse is inputted to the latch circuit 4' and is held as ON/OFF information. In accordance with the ON/OFF information held in the latch circuit 4', a high-side gate signal HG is outputted from the driver circuit 5, and the high-side gate signal HG outputted from the drive circuit 5 goes to the "H" level in response to the ON pulse Pon, the high-side switching element 6 is driven to turn on and this status is held by the latch circuit 4'. Further, when the OFF pulse Poff is inputted, the high-side gate signal HG outputted from the drive circuit 5 goes to the "L" level, so driving of the high-side switching element 6 is stopped to turn off.

In contrast, processing on the low-side input signals LS is carried out as follows. With respect to driving of the low-side switching element 8, a low-side input signal LS is supplied to te drive circuit 7, and the gate if the ow-side watching element 8 is driven by the low-side gate signal LG outputted from this drive circuit 7. That is, when the low-input signal LS rises to the "H" level (at the timing t3), the low-side gate signal LG outputted from the drive circuit 7 goes to the "H" level, and the low-side switching element 8 turns on. At this time, a leading edge of the low-side input signal LS is detected by the edge detection circuit (for low-side signals) 19, and an OFF pulse Poff is outputted from the OFF pulse generation circuit 3. This OFF pulse Poff is supplied to the latch circuit 4', and the high-side gate signal HG outputted from the drive circuit 5 is forcedly set to the "L" level. However, the high-side gate signal HG maintains the "L" level because normal operation is carried out at the timings t3 and t4 shown in FIG. 15.

Further, when the low-side input signal LS falls to the "L" level (at the timing t4), the low-side gate signal LG outputted from the drive circuit 7 goes to the "L" level, the low-side switching element 8 turns off. At this time, a leading edge of the low-side input signal LS is detected by the edge detection circuit 19, and therefore, the OFF pulse generation circuit 3 generates an OFF pulse Poff, based on a detection output of the edge detection circuit 1'.

Thus, driving (ON) of the low-side switching element 8 by the low-side input signal LS is detected, and an OFF pulse Poff is generated from the OFF pulse generation circuit in response to a rise of the low-side input LS. Further, when ON of the low-side switching element 8 is detected by the low-side input signal LS, the high-side gate signal HG is forcedly set to the "L" level thereby to perform operation of turning off the high-side switching element, regardless of the high-side input signal HS.

Figure 15:
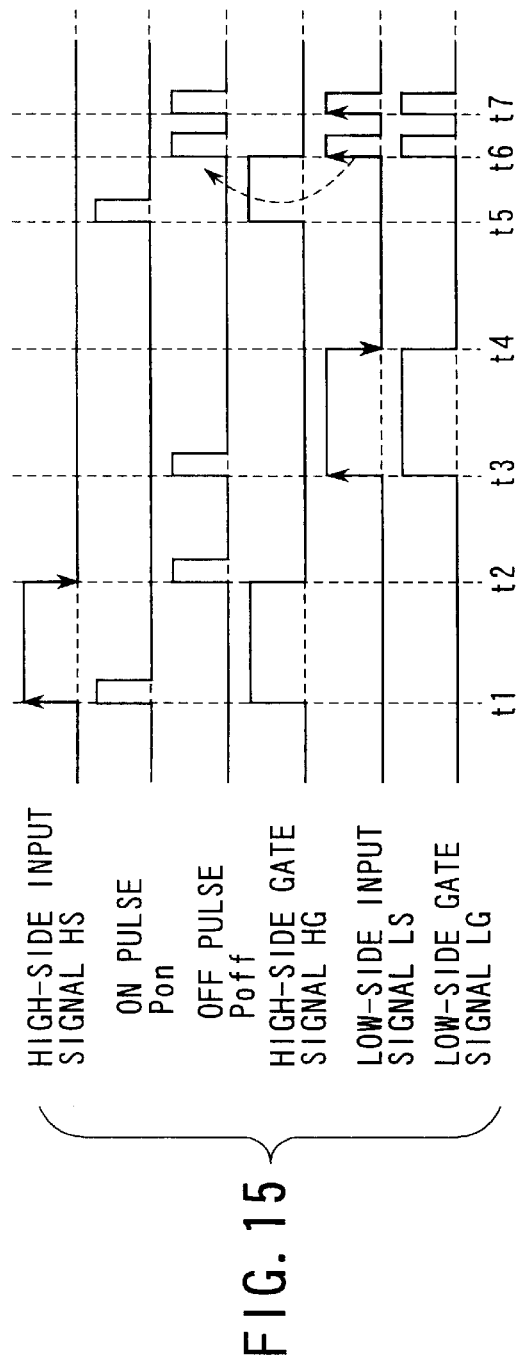
FIG. 15 is a timing chart for explaining operation of the gate driver shown in FIG. 14.

Thus according to the structure as described above, operation of forcedly turn off the high-side switching element is carried out in response to a rise of the low-side input signal LS in case where the low-side switching element turns on in a state that an OFF pulse Poff of an operation error is generated due to noise or a shift of an output, as indicated by the timing t5 in the timing chart shown in FIG. 15, and the high-side gate driver circuit 201 erroneously operates to turn on erroneously the high-side switching element 6 suddenly. In this manner, it is possible to avoid a situation that the switching elements 6 and 8 of the high and low sides are simultaneously turned on thereby allowing a penetrating current to flow. Therefore, it is possible to reduce frequent occurence of operations of the protect function and breakdown of the switching elements 6 and 8.

[Eighth Embodiment]

Figure 17:
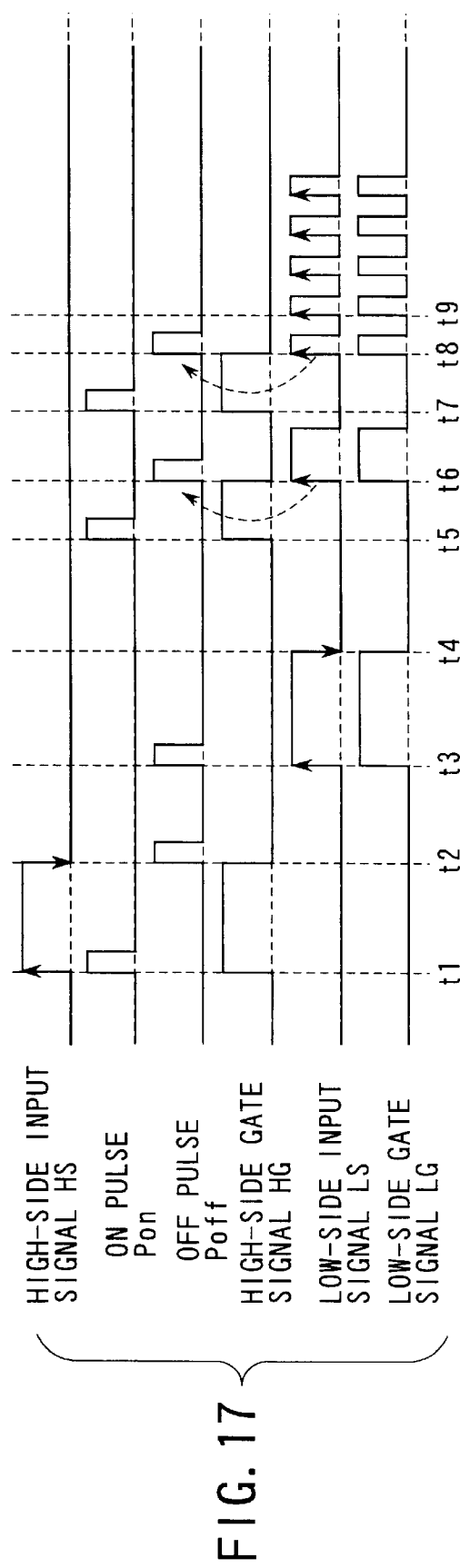
FIG. 17 is a timing chart for explaining operation of the gate driver shown in FIG. 16.
Figure 16:
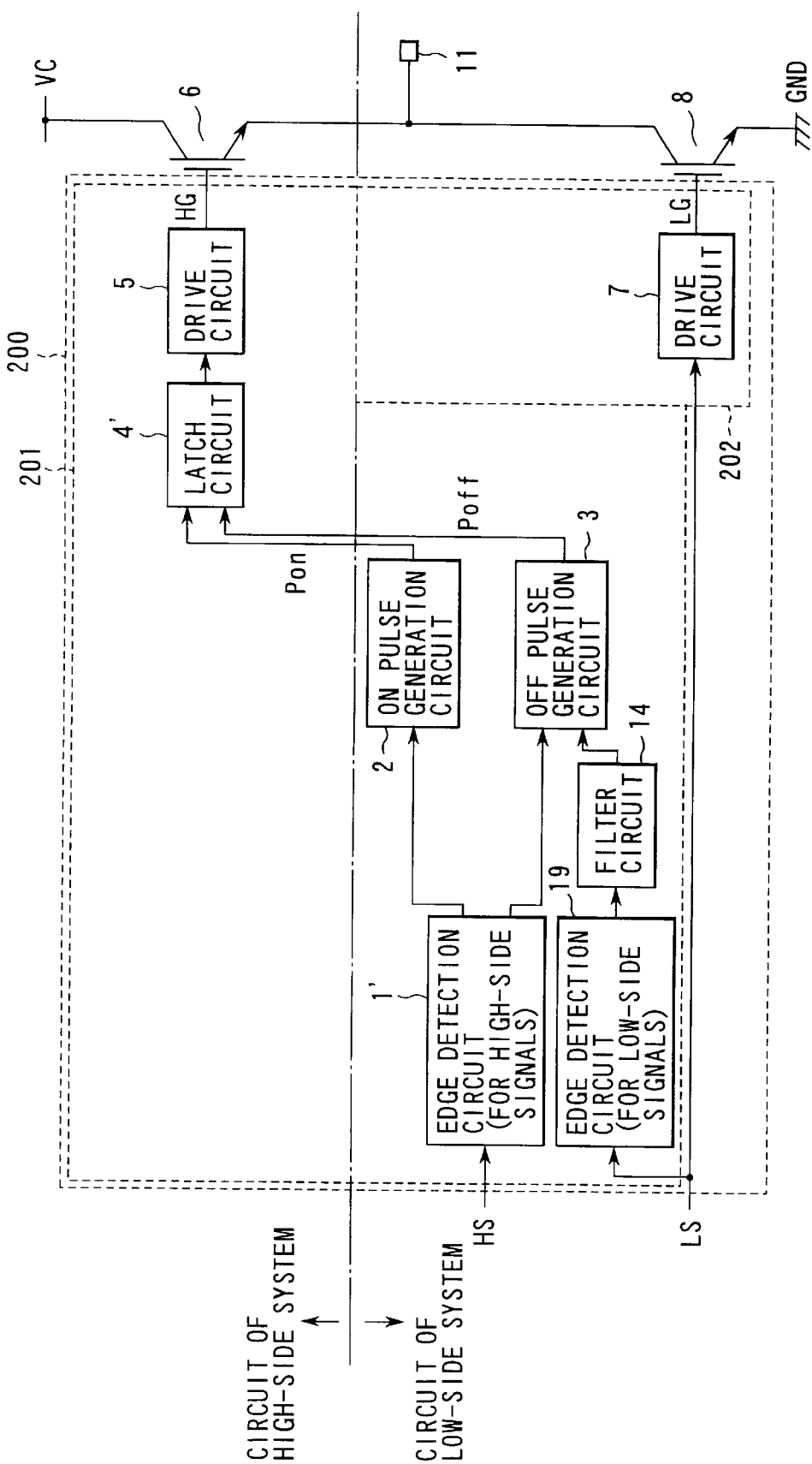
FIG. 16 is a block diagram showing a gate driver according to the eighth embodiment of the present invention.

FIGS. 16 and 17 are respectively explanatory views for a high-side gate driver according to the eighth embodiment of the present invention. FIG. 16 is a block diagram showing the circuit configuration thereof. FIG. 17 is a timing chart showing operation of the circuit shown in FIG. 16. In FIG. 16, the same parts as those of FIG. 14 are denoted at common reference symbols, and detailed explanation thereof will be omitted herefrom.

This circuit is constructed by adding a filter circuit 14 between an edge detection circuit (for low-side signals) 19 and an OFF pulse generation circuit 3, in the high-side gate driver circuit 201 shown in FIG. 14.

Basic operation thereof is the same as that of the first embodiment.

The gate driver according to the second embodiment performs different operations, depending on the cycle of the low-side input signal LS by the function of the filter circuit 14. If the signal LS is inputted at a long cycle, an OFF pulse Poff is generated (operation as indicated at the timing t6) thereby to turn off the high-side switching element 6.

Meanwhile, if the cycle of the signal LS is short, an OFF pulse Poff is generated (operation indicated at the timing t8) in response to the signal which comes first, and the high-side switching element 6 is turned off. In response to the signal which comes second, no OFF pulse Poff is generated.

In the structure as described above, supposing use in which a three-phase motor is subjected to PWM (Pulse Width Modulation) by a gate driver, generation of OFF pulses Poff depending on the low side input signal LS is restricted to the minimum, so that current consumption can be reduced. It is considered that there is a low possibility to cause erroneous turning-on while the low-side switching element 8 is repeatedly turned on and off under the PWM control. Hence, the filter circuit 14 is used to distinguish a PWM control start time and a control period from each other, and a limitation is added such that OFF pulses Poff are generated only at the time of staring the PWM control. In this manner, the current consumption when an OFF pulse Poff is generated is reduced to the minimum, so that a penetrating current due to erroneous turning-on of the high-side switching element 6 can be prevented.

[Ninth Embodiment]

Figure 18:
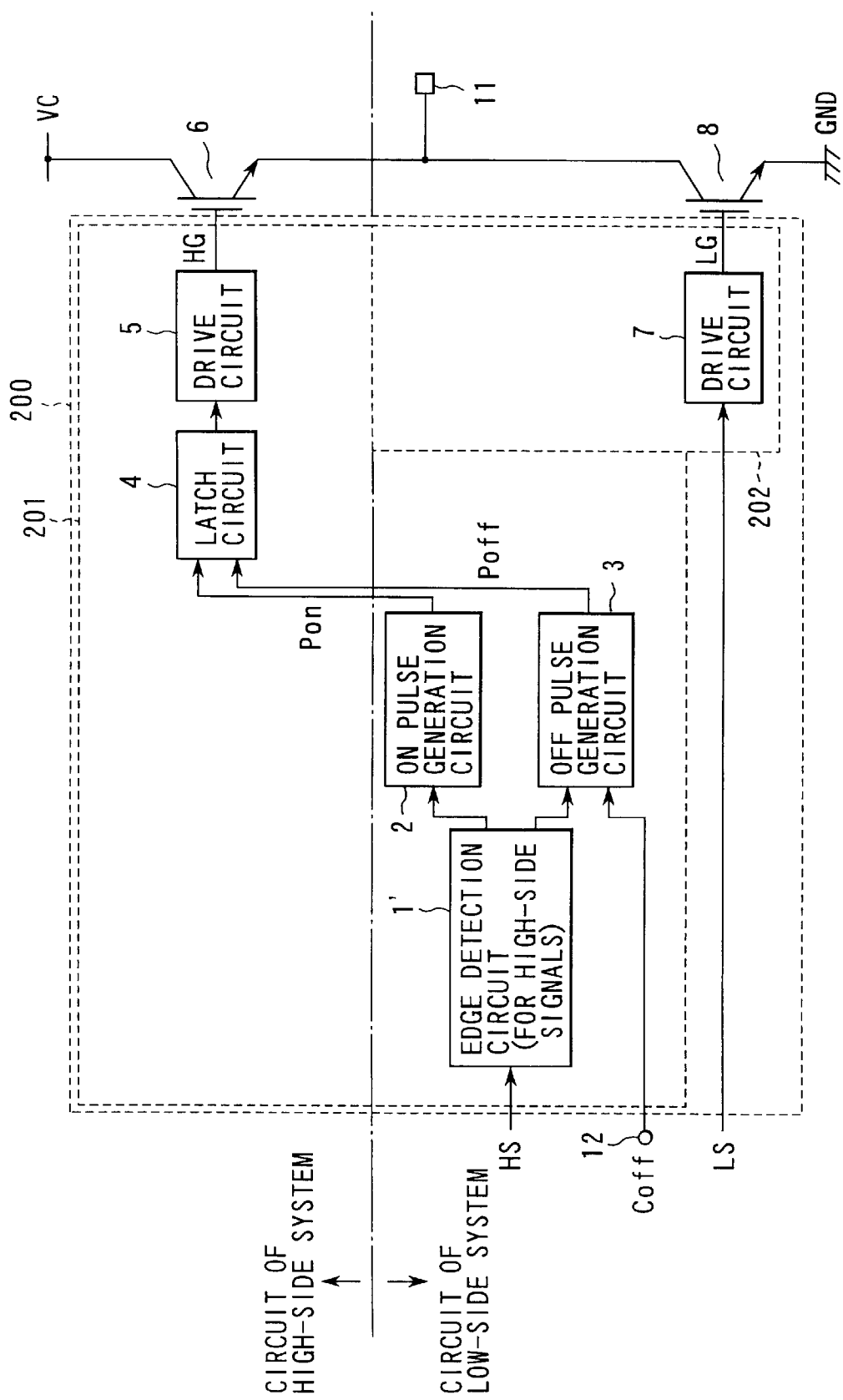
FIG. 18 is a block diagram showing a gate driver according the ninth embodiment of the present invention.

FIG. 18 shows a gate driver according to the ninth embodiment of the present invention. In the gate driver shown in the eight embodiment, an input terminal 12 is provided in place of the edge detection circuit (for low-side signals) 19 and the filter circuit 14. This input terminal 12 is inputted with a high-side forced OFF signal Coff for forcedly turning off the high-side switching element 6 from the outside.

Figure 19:
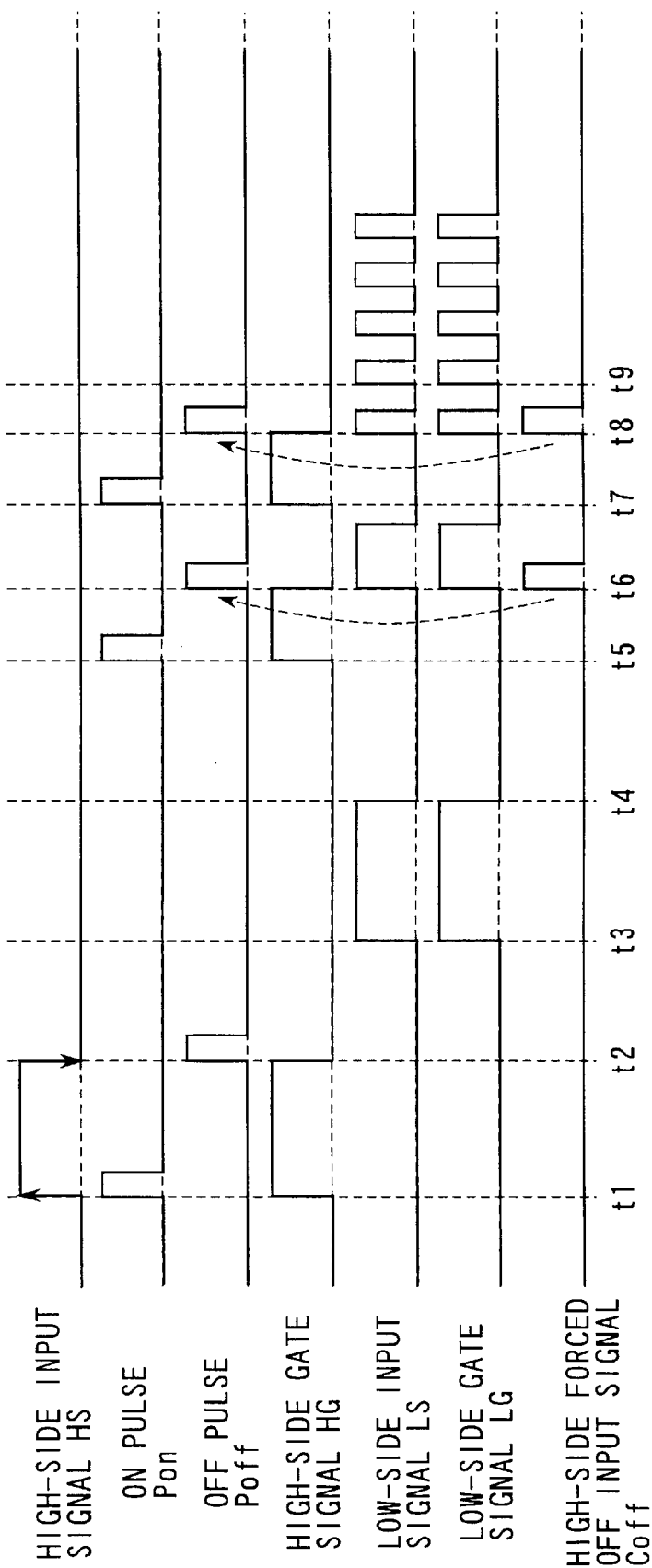
FIG. 19 is a timing chart for explaining operation of the gate driver shown in FIG. 18.

Next, explanation will be made of operation depending on the present embodiment, with reference to the timing chart shown in FIG. 19. Basic operation thereof is the same as that of the second embodiment. The high-side forced OFF signal Coff is given not by generating a timing from the low-side input signal LS but by a necessary timing from the outside, as indicated at timing from the outside, as indicated at timings t6 and t8 in FIG. 19. The high-side switching element 6 is turned off at this timing.

According to the structure as described above, it is possible to reduce generation of OFF pulses Poff to the minimum and to reduce thereby the current consumption, in case of supposing a use in which a three-phase motor is subjected to PWM control by a gate driver, like the second embodiment. In addition, ON pulses Pon are generated at operation timings when erroneous turning-on easily appears, by a control circuit (which is mainly a micro-computer or the like) connected to the gate driver. In this manner, the current consumption when OFF pulses Poff are generated is reduced to the minimum, so that a penetrating current can be prevented from being generated from erroneous turning-on of the high-side switching element 6.

[Tenth Embodiment]

Figure 20:
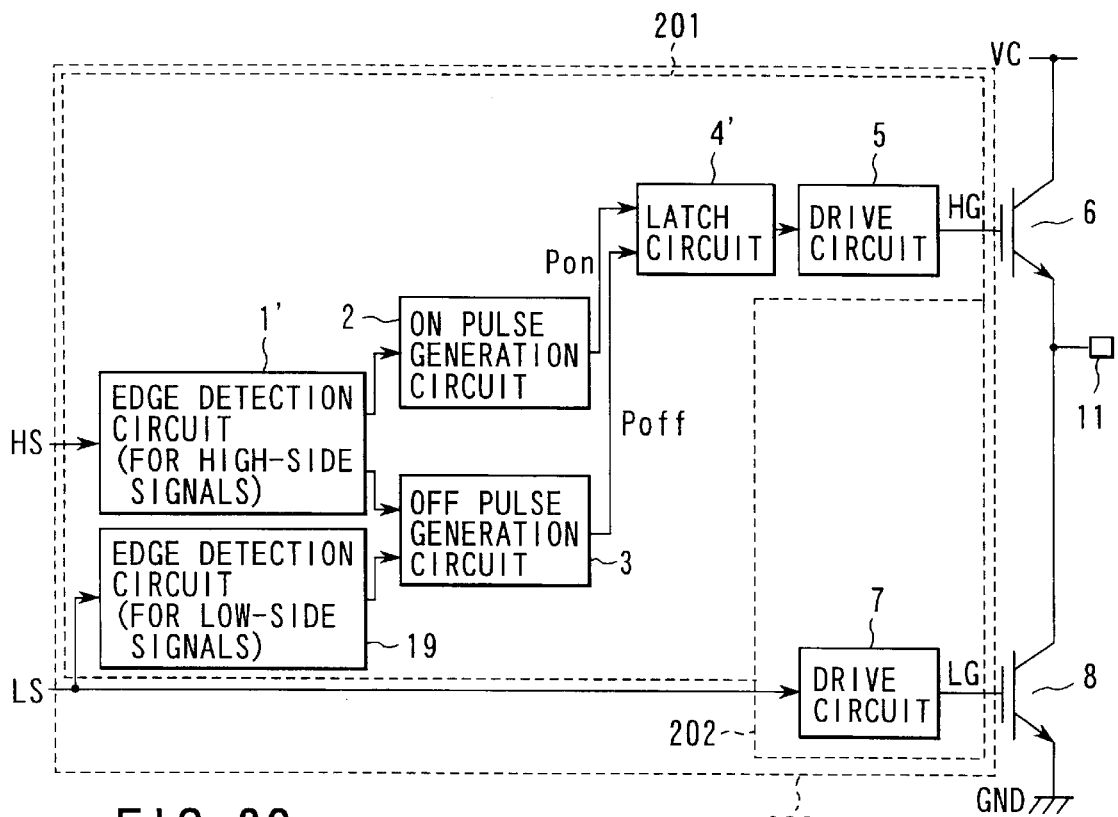
FIG. 20 is a block diagram showing a gate driver according to the tenth embodiment of the present invention.

FIG. 20 shows a gate driver according to the tenth embodiment of the present invention. In the gate driver structure according to the seventh embodiment described above, the driver circuit 7 (corresponding to a low-side gate driver circuit 202) for generating a low-side gate signal LG in response to a low-side input signal LS is also integrated together with a high-side gate driver circuit 201 into one-chip 300.

Basic operation and effects of the gate driver according to the present tenth embodiment are the same as those described in the first embodiment.

According to the structure described above, the high-side gate driver circuit 201 and the low-side gate driver circuit 202 are integrated in one-chip 300. In this manner, it is impossioble to prevent a penetrating current due to erroneous operation of the high-side gate driver circuit 201 while achieving space saving and cost reduction.

[Eleventh Embodiment]

Figure 21:
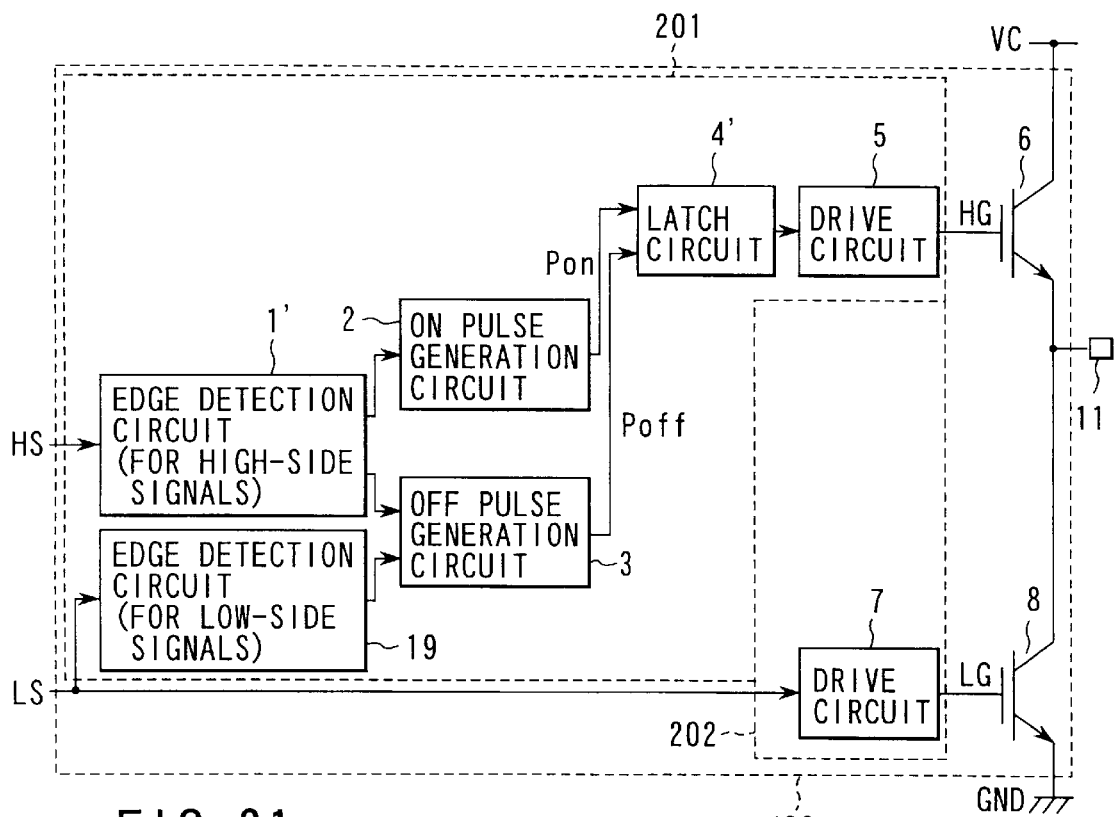
FIG. 21 is a block diagram showing a gate driver according to the eleventh embodiment of the present invention.

FIG. 21 shows a gate driver according to the eleventh embodiment of the present invention. In the gate driver structure according to the tenth embodiment described above, the high-side and low-side switching element 6 and 8 are integrated in one-chip 400.

Basic operation and effects of the gate driver according to the present eleventh embodiment are the same as those described in the first embodiment.

According to the structure described above, the gate driver and the switching elements are integrated in one-chip 400. In this manner, it is possible to prevent a penetrating current due to erroneous operation of the high-side gate driver circuit 201 while achieving space saving and cose reduction.

As has been explained above, according to the present invention, it is possible to attain a gate driver and a power converter which can eliminate abnormal operation even if an output element is prevented from breaking down.

Also, it is possible to attain a gate driver which can prevent the high-side and low-side switching elements from being on simultaneously even if a high-side switching element is erroneously turned on when a high-side switching element is instructed to be off by a high-side input signal.

Further, it is possible to obtain a gate driver capable of preventing forced stop and breakdown of switching elements due to operation of an excessive current protect circuit caused by a penetrating current flowing between a power supply and a ground point.

Further , it is possible to obtain a gate driver capable of saving space and costs.

Additional advantages and modifications will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

What is claimed is:

1. A gate driver comprising:
an edge detection circuit for detecting leading and trailing edges of a control input signal;
an ON pulse generation circuit for generating an ON pulse in response to the leading or trailing edge of the control input signal, which is detected by the edge detection circuit;
a first OFF pulse generation circuit for generating a first OFF pulse in response to the leading or trailing edge of the control input signal, which is detected by the edge detection circuit;
a status hold circuit for driving an output element in response to the ON pulse outputted from the ON pulse generation circuit and for holding driving status of the output element until the first OFF pulse is outputted from the first OFF pulse generation circuit; and
a second OFF pulse generation circuit for generating a second OFF pulse in response to a protect operation signal and for supplying the second OFF pulse to the status hold circuit, thereby to stop driving of the output element when protect operation is instructed by the protect operation signal.

2. The gate driver according to claim 1, further comprising an abnormality detection circuit for detecting abnormal status, and a protect operation signal generation circuit for generating the protect operation signal when an abnormality is detected by the abnormality detection circuit and for supplying the protect operation signal to the second OFF pulse generation circuit.

3. The gate driver according to claim 1, wherein the second OFF pulse generation circuit generates the second OFF pulse only when the control input signal is at a level which instructs turn-off of the output element.

4. A gate driver comprising:
an edge detection circuit supplied with a control input signal and a protect operation signal, for detecting leading and trailing edges of the control input signal, the edge detection circuit being let stop operating when protect operation is instructed by the protect operation signal;
an ON pulse generation circuit for generating an ON pulse in response to the leading or trailing edge of the control input signal, which is detected by the edge detection circuit;
a first OFF pulse generation circuit for generating a first OFF pulse in response to the leading or trailing edge of the control input signal, which is detected by the edge detection circuit;
a status hold circuit for driving an output element and for hodling driving status of the output element until the first OFF pulse is outputted from the first OFF pulse generation circuit; and
a second OFF pulse generation circuit for generating a second OFF pulse in response to the control input signal and the protect operation signal and for providing the second OFF pulse to the status hold circuit, wherein
when turn-off of the outpur element is instructed by the control input signal and protect operation is instructed by the protect operation signal, the second OFF pulse is oputputted to stop driving of the output element.

5. A gate driver comprising:
an abnormality detection circuit for detecting abnormal status;
a protect operation signal generation circuit for generating a protect operation signal when an abnormality is detected by the abnormality detection circuit;
a first determination circuit inputted with a control input signal of a high side, a control input signal of a low side, and the protect operation signal, for determining whether the control input signal of the high-side can be transmitted or not depending on status of the control input signal of the low side and the protect operation signal;
a second determination circuit inputted with a control input signal of a high side, a control input signal of a low side, and the protect operation signal, for determining whether the control input signal of the low side can be transmitted or not depending on status of the control input signal of the high side and the protect operation signal, and to drive the low-side output element;
a trigger signal generation circuit inputted with the protect operation signal, for generating a trigger signal for generating a high-side OFF pulse in synchronization with generation of the protect operation signal;
a third determination circuit supplied with the trigger signal outputted from the trigger signal generation circuit and an output signal from the first determination circuit, for determining whether the trigger signal can be transmitted or not depending on status of the control input signal of the high side;
an OFF pulse generation circuit supplied with the output signal from the first determination circuit and an output signal from the third determination circuits, for detecting falling of the control input signal of the high side and falling of the trigger signal and for generating an OFF pulse;
an ON pulse generation circuit supplied with the output signal of the first determination circuit, for detecting rising of the control input signal of the high side, and for generating an ON pulse; and
a status hold circuit 24 for driving a high-side output element in response to the ON pulse outputted from the ON pulse generation circuit, and for holding driving status of the high-side output element until the OFF pulse is outputted from the OFF pulse generation circuit.

6. A power converter constructed by integrating a gate driver and an output element driven by the gate driver, in one-chip, the gate driver comprising:
an edge detection circuit for detecting leading and trailing edges of a control input signal;
an ON pulse in response to the leading or trailing edge of the control input signal, which is detected by the edge detection circuit;
a first OFF pulse generation circuit for generating a first OFF pulse in response to the leading or trailing edge of the control input signal, which is detected by the edge detection circuit;
a status hold circuit for driving the output element in response to the ON pulse outputted from the ON pulse generation circuit and for holding driving status of the output element until the first OFF pulse is outputted from the first OFF pulse generation circuit; and
a second OFF pulse generation circuit for generating a second OFF pulse in response to a protect operation signal and for supplying the second OFF pulse to the status hold circuit, thereby to stop driving of the output element.

7. The power converter according to claim 6, wherein the gate driver further comprises an abnormality detection circuit for detecting abnormal status, and a protect operation signal generation circuit for generating the protect operation signal when an abnormality is detected by the abnormality detection circuit and for supplying the protect operation signal to the second OFF pulse generation circuit.

8. The power converter according to claim 6, wherein the second OFF pulse generation circuit generates the second OFF pulse only when the control input signal is at a level which instructs turn-off of the output element.

9. A power converter constructed by integrating a gate driver and high-side and low-side output elements driven by the gate driver, in one-chip, the gate driver comprising:
- an abnormality detection circuit for detecing abnormal status;
- a protect operation signal generation circuit for generating a protect operation signal when an abnormality is detected by the abnormality detection circuit;
- a first determination circuit inputted with a control input signal of a high side, a control input signal of a low side, and the protect operation signal, for determining whether the control input signal of the high-side can be transmitted or not depending on status of the control input signal of the low side and the protect operation signal;
- a second determination circuit inputted with a control input signal of a high side, a control input signal of a low side, and the protect operation signal, for determining whether the control input signal of the low side can be transmitted or not depending on status of the control input signal of the high side and the protect operation signal, and to drive the low-side output element;
- a trigger signal generation circuit inputted with the protect operation signal, for generating a trigger signal for generating a high-side OFF pulse in synchronization with generation of the protect operation signal;
- a third determination circuit supplied with the trigger signal outputted from the trigger signal generation circuit and an output signal from the first determination circuit, for determining whether the trigger signal can be transmitted or not depending on status of the control input signal of the high side;
- an OFF pulse generation circuit supplied with the output signal from the first determination circuit and an output signal from the thrid determination circuits, for detecting falling of the control input signal of the high side and falling of the trigger signal and for generating an OFF pulse;
- an ON pulse generation circuit supplied with the output signal of the first determination circuit, for detecting rising of the control input signal of the high side, and for generating an ON pulse; and
- a status hold circuit for driving a high-side output element in response to the ON pulse outputted from the ON pulse generation circuit, and for holding driving status of the high-side output element until the OFF pulse is outputted from the OFF pulse generation circuit.

10. A gate driver for controlling high-side and low-side switching elements constructed in a push/pull structure, comprising a high-side gate driver circuit for driving the high-side switching element in response to a high-side input signal, and a low-side gate driver circuit for driving the low-side switching element, the high-side gate driver circuit including:
- a first edge detection circuit for detecting leading and trailing edges of the high-side input signal for driving the high-side switching element;
- a second edge detection circuit for detecting leading and trailing edges of the low-side input signal for driving the low-side switching element;
- an ON pulse generation circuit for generating an ON pulse, based on a detection output of the first edge detection circuit;
- an OFF pulse generation circuit for generating an OFF pulse, based on detection outputs of the first and second edge detection circuits;
- a latch circuit supplied with each of the ON pulse outputted from the ON pulse generation circuit and the OFF pulse outputted from the OFF pulse generation circuit, for holding ON/OFF information of the high-side switching element instructed by the high-side input signal; and
- a drive circuit for outputting a high-side gate signal for controlling the high-side switching element in accordance with the ON/OFF information held by the latch circuit, and
- when driving of the low-side switching element is instructed by the low-side input signal, the OFF pulse is generated from the OFF pulse generation circuit thereby to forcedly turn off the high-side switching element.

11. The gate driver according to claim 10, further comprising a filter circuit supplied with the detection output of the second edge detection circuit, a PWM (Pulse Width Modulation) control start time and a control period are distinguished from each other by the filter circuit, and the detection output of the second edge detection circuit is supplied to the OFF pulse generation circuit only at the PWm control start time.

12. The gate driver acording to claim 10, wherein the high-side gate driver circuit and the low-side gate driver circuit are integrated in one-chip.

13. A power converter constructed by integrating a high-side and low-side switching elements having a push/pull structure, a high-side gate driver circuit for driving the high-side switching element in response to a high-side input signal, and a low-side gate driver circuit for driving the low-side switching element in response to a low-side input signal, in one-chip, the high-side gate driver circuit including:
- a first edge detection circuit for detecting leading and trailing edges of the high-side input signal for driving the high-side switching element;
- a second edge detection circuit for detecting leading and trailing edges of the low-side input signal for driving the low-side switching element;
- an ON pulse generation circuit for generating an ON pulse, based on a detection output of the first edge detection circuit;
- an OFF pulse generation circuit for generating an OFF pulse, based on detection outputs of the first and second edge detection circuits;
- a latch circuit supplied with each of the ON pulse outputted from the ON pulse generation circuit and the OFF pulse outputted from the OFF pulse generation circuit, for holding ON/OFF information of the high-side switching element instructed by the high-side input signal; and
- a drive circuit for outputting a high-side gate signal for controlling the high-side switching element in accordance with the ON/OFF information held by the latch circuit, wherein
when driving of the low-side switching element is instructed by the low-side input signal, the OFF pulse is generated from the OFF pulse generation circuit thereby to forcedly turn off the high-side switching element.

14. A gate driver for controlling the high-side and low-side switching elements having a push/pull structure, comprising a high-side gate driver circuit for driving the high-side switching element in response to a high-side input signal, and a low-side gate driver circuit for driving the low-side switching element in response to a low-side input signal, the high-side gate driver circuit including:
an edge detection circuit for detecting leading and trailing edges of the high-side input signal for driving the high-side switching element;
an input terminal externally inputted with a high-side forced OFF signal for forcedly turning off the high-side switching element;
an ON pulse generation circuit for generating an ON pulse, based on a detection output of the edge detection circuit;
an OFF pulse generation circuit for generating an OFF pulse, based on the detection output of the edge detection circuit and the high-side forced OFF signal inputted through the input terminal;
a latch circuit supplied with each of the ON pulse outputted from the ON pulse generation circuit and the OFF pulse outputted from the OFF pulse generation circuit, for holding ON/OFF information of the high-side switching element instructed by the high-side input signal; and
a drive circuit for outputting a high-side gate signal for controlling the high-side switching element in accordance with the ON/OFF information held by the latch circuit, wherein
when the input terminal is inputted with the high-side forced OFF signal, the high-side switching element is forcedly turned off.

15. The gate driver according to claim 14, wherein the high-side gate driver circuit and the low-side gate driver are integrated in one-chip.

16. A power converter constructed by integrating high-side and low-side switching elements having a push/pull structure, a high-side gate driver circuit for driving the high-side switching element in response to a high-side input signal, and a low-side gate driver circuit for driving the low-side switching element in response to a low-side input signal, in one-chip, the high-side gate driver circuit including:
an edge detection circuit for detecting leading and trailing edges of the high-side input signal for driving the high-side switching element;
an input terminal externally inputted with a high-side forced OFF signal for forcedly turning off the high-side switching element;
an ON pulse generation circuit for generating an ON pulse, based on the detection output of the edge detection circuit;
an OFF pulse generation circuit for generating an OFF pulse, based on the detection output of the edge detection circuit and the high-side forced OFF signal inputted through the input terminal;
a latch circuit supplied with each of the ON pulse outputted from the ON pulse generation circuit and the OFF pulse outputted from the OFF pulse generation circuit, for holding ON/OFF information of the high-side switching element instructed by the high-side input signal; and
a drive circuit for outputting a high-side gate signal for controlling the high-side switching element in accordance with the ON/OFF information held by the latch circuit, wherein
when the input terminal is inputted with the high-side force OFF signal, the high-side switching element is forcedly turned off.

17. A gate driver configured to control high-side and low-side switching elements constructed in a push/pull structure, comprising a high-side gate driver circuit configured to drive the high-side switching element in response to a high-side input signal, and a low-side gate driver circuit configured to drive the low-side switching element, the high-side gate driver circuit including:
an edge detection circuit configured to detect leading and trailing edges of the high side input signal;
an ON pulse generation circuit configured to generate an ON pulse based on a first detection output of the edge detection circuit;
an OFF pulse generation circuit configured to generate an OFF pulse based on a second detection output of the edge detection circuit;
a latch circuit supplied with each of the ON pulse outputted from the ON pulse generation circuit and the OFF pulse outputted from the OFF pulse generation circuit, and configured to hold and output ON/OFF information of the high-side switching element; and
a drive circuit configured to output a high-side gate signal to control the high-side switching element in accordance with the ON/OFF information received from the latch circuit, wherein
when driving of the low-side switching element is instructed by the low-side input signal, the high-side switching element forcedly tuned off based on the low-side input signal.

18. The gate driver according to claim 17, wherein the high-side gate driver circuit and the low-side gate driver circuit are integrated together in one-chip.

19. A power converter constructed by integrating high-side and low-side switching elements having a push/pull structure, a high-side gate driver circuit configured to drive the high-side switching element in response to a high-side input signal, and a low-side gate driver circuit configured to drive the low-side switching element in response to a low-side input signal all together in one-chip, the high-side gate driver circuit including:
an edge detection circuit configured to detect leading and trailing edges of the high-side input signal;
an ON pulse generation circuit configured to generate an ON pulse based on a first detection output of the edge detection circuit;
an OFF pulse generation circuit configured to generate an OFF pulse based on a second detection output of the edge detection circuit;
a latch circuit supplied with each of the ON pulse outputted from the ON pulse generation circuit and the OFF pulse outputted from the off pulse generation circuit, and configured to hold and output ON/OFF information of the high-side switching element; and
a drive circuit configured to output a high-side gate signal for controlling the high-side switching element in accordance with the ON/OFF information received from the latch circuit, wherein when driving of the low-side switching element is instructed by the low-side input signal, the high-side-switching element forcedly tuned off based on the low-side input signal.

20. A gate driver configured to control high-side and low-side switching elements having a push-pull structure, comprising a high-side gate driver circuit configured to drive the high-side switching element in response to a high-side input signal, and a low-side gate driver circuit configured to drive the low-side switching element in response to a low-side input signal, the high-side gate driver circuit including:

an edge detection circuit configured to detect leading and tailing edges of the high-side input signal;

an input terminal externally inputted with a high-side forced OFF signal to forcedly turn off the high-side switching element;

an ON pulse generation circuit configured to generate an ON pulse based on a first detection output of the edge detection circuit;

an OFF pulse generation circuit configured to generate an OFF pulse based on a second detection output of the edge circuit;

a latch circuit supplied with each of the ON pulse outputted from the ON pulse generation circuit and the OFF pulse outputted from the OFF pulse generation circuit, and configured to hold and output ON/OFF information of the high-side switching element; and a drive circuit configured to output a high-side gate signal to control the high-side switching element in accordance with the ON/OFF information received from the latch circuit wherein when the input terminal in inputted with the high-side forced OFF signal, the high-side switching element is forcedly turned off.

21. The gate driver according to claim 20, wherein the high-side gate driver circuit and the low-side gate driver circuit and integrated together in one-chip.

22. A power converter constructed by integrating high-side and low-side switching elements having a push/pull structure, a high-side gate driver circuit configured to drive the high-side switching element in response to a high-side input signal, and a low-side gate driver circuit configured to drive the low-side switching element in response to a low-side input signal all together in one-chip, the high-side gate driving circuit including:

an edge detection circuit configured to detect leading and trailing edges of the high-side input signal;

an input terminal externally inputted with a high-side forced OFF signal to forcedly turn off the high-side switching element;

an ON pulse generation circuit configured to generate an ON pulse based on a first detection output of the edge detection circuit;

an off pulse generation circuit configured to generate an off pulse based on a second detection output of the edge detection circuit;

a latch circuit supplied with each of the ON pulse outputted from the ON pulse generation circuit and the OFF pulse outputted from the OFF pulse generation circuit, and configured to hold and output ON/OFF information of the high-side switching element; and a drive circuit configured to output a high-side gate signal to control the high-side switching element in accordance with the ON/OFF information received from the latch circuit, wherein when the input terminal is inputted with the high-side forced OFF signal, the high-side switching element is forcedly turned off.

* * * * *